(12) United States Patent
Min et al.

(10) Patent No.: US 10,725,082 B2
(45) Date of Patent: Jul. 28, 2020

(54) DEVICE AND METHOD FOR MEASURING ELECTRIC FIELD BY USING MOS CAPACITOR

(71) Applicant: SNU R&DB FOUNDATION, Seoul (KR)

(72) Inventors: Sang Lyul Min, Seoul (KR); Yong Hun Lee, Seoul (KR)

(73) Assignee: SNU R&DB FOUNDATION, Seoul (KR)

( * ) Notice: Subject to any disclaimer, the term of this patent is extended or adjusted under 35 U.S.C. 154(b) by 245 days.

(21) Appl. No.: 15/647,755

(22) Filed: Jul. 12, 2017

(65) Prior Publication Data

US 2018/0003757 A1 Jan. 4, 2018

Related U.S. Application Data

(63) Continuation of application No. PCT/KR2015/007103, filed on Jul. 9, 2015.

(30) Foreign Application Priority Data

Jan. 14, 2015 (KR) .................. 10-2015-0006984

(51) Int. Cl.
*G01R 29/12* (2006.01)
*G01R 29/08* (2006.01)
*G01R 15/16* (2006.01)
*G01R 29/24* (2006.01)
*H01L 27/02* (2006.01)

(52) U.S. Cl.
CPC .......... *G01R 29/12* (2013.01); *G01R 15/165* (2013.01); *G01R 29/0814* (2013.01); *G01R 29/0878* (2013.01); *G01R 29/24* (2013.01); *H01L 27/0251* (2013.01)

(58) Field of Classification Search
CPC .... G01R 29/12; G01R 29/0814; G01R 29/24; H01L 27/0251
See application file for complete search history.

(56) References Cited

U.S. PATENT DOCUMENTS

| 4,866,645 | A | | 9/1989 | Lish |
| 5,506,178 | A | * | 4/1996 | Suzuki .............. H01L 21/28185 257/E29.162 |
| 2012/0194799 | A1 | | 8/2012 | Kamiyama et al. |
| 2014/0288898 | A1 | | 9/2014 | Fukuda |

FOREIGN PATENT DOCUMENTS

| JP | 09-129694 A | 5/1997 |
| JP | 2005-216993 A | 8/2005 |
| WO | WO-2013176372 A1 * | 11/2013 ......... G11C 11/5628 |

OTHER PUBLICATIONS

International Search Report received for PCT Patent Application No. PCT/KR2015/007103, dated Sep. 25, 2015, 2 pages.

* cited by examiner

*Primary Examiner* — Amy He

(57) ABSTRACT

One embodiment provides a technique of adjusting a gate voltage to be applied to at least one MOS capacitor and an amount of electric charges to be stored in the MOS capacitor so as to determine a sensitivity of a change in the amount of electric charges stored in the MOS capacitor, and exposing the MOS capacitor to an electric filed for a predetermined amount of time and then reading an electron inflow or outflow result due to the electric field so as to interpret the intensity and the direction of the electric field, thereby measuring the intensity and the direction of the electric field.

19 Claims, 22 Drawing Sheets

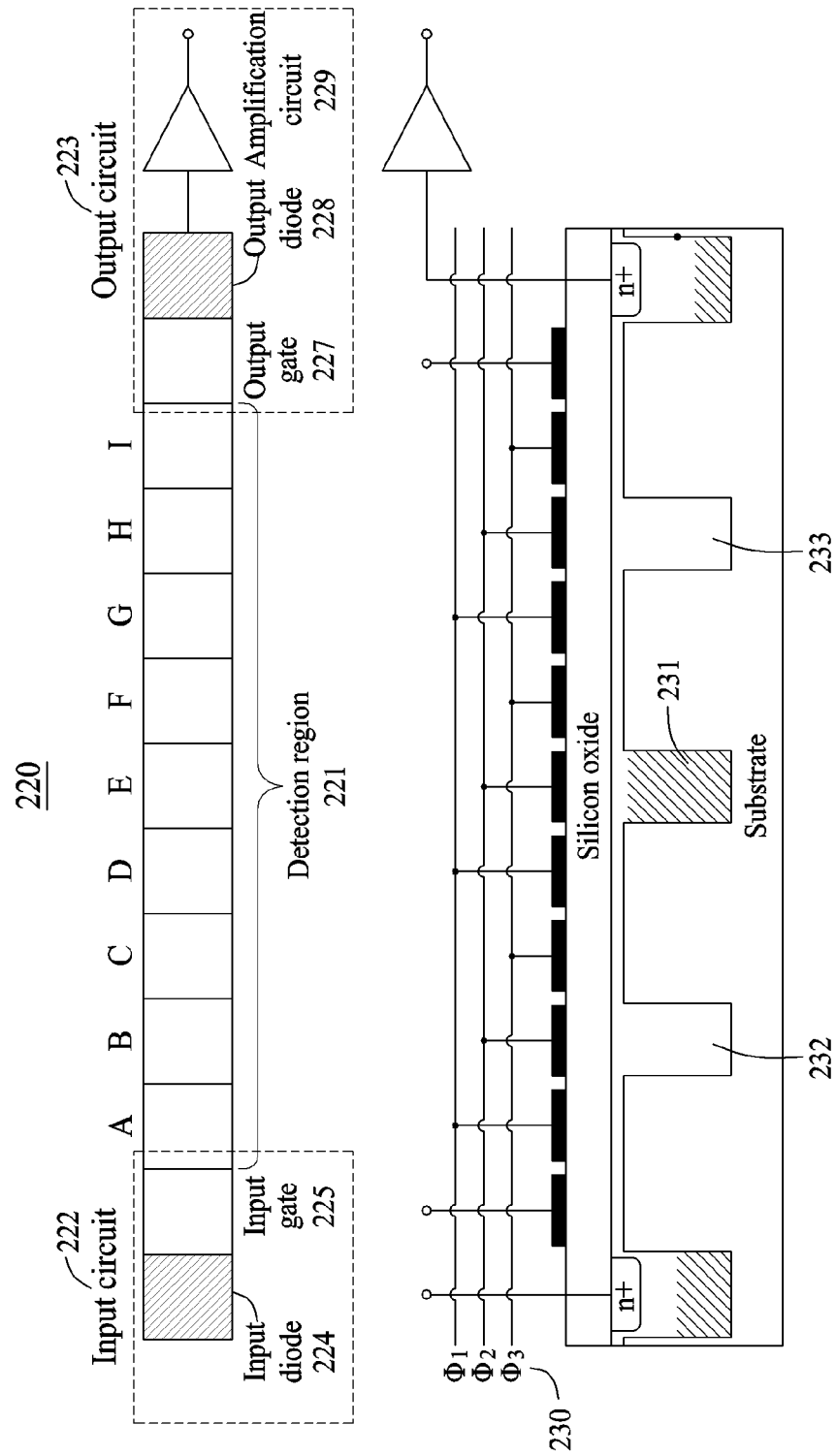

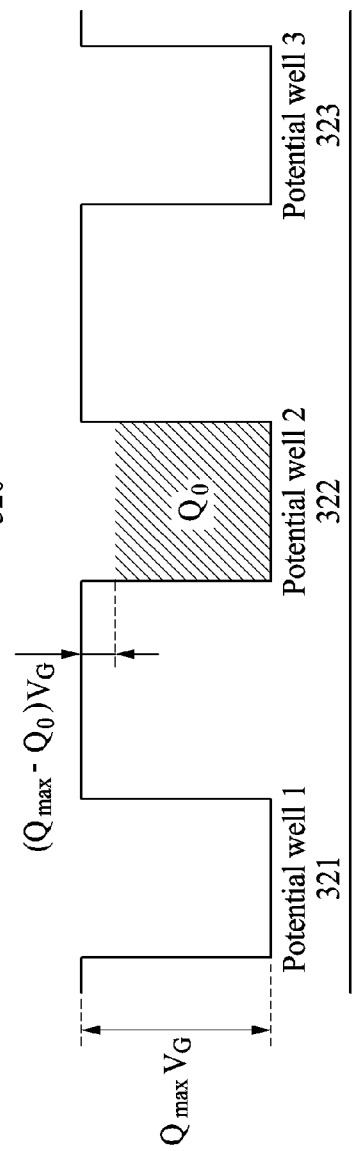
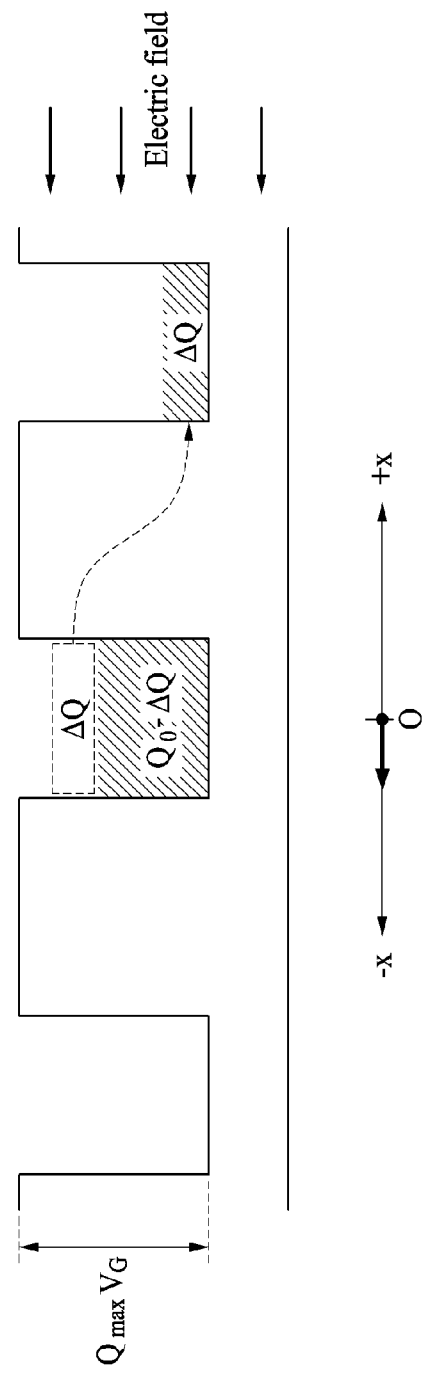
FIG. 3B

FIG. 3C
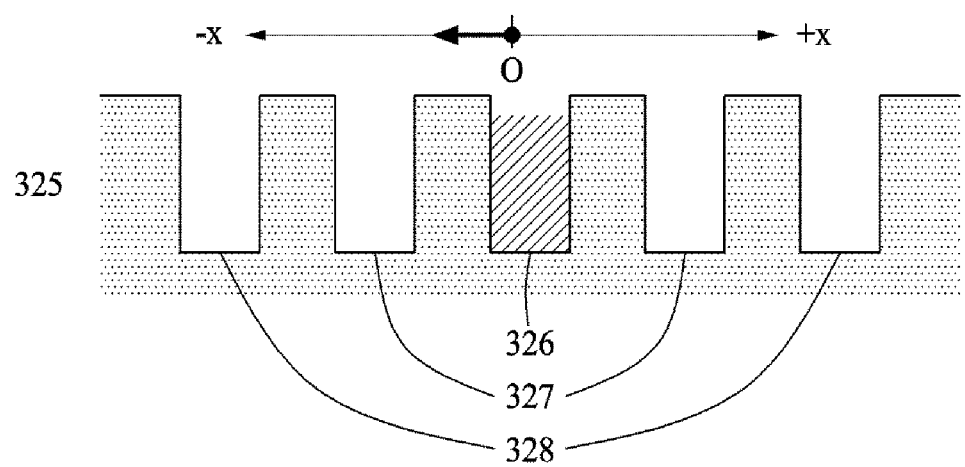
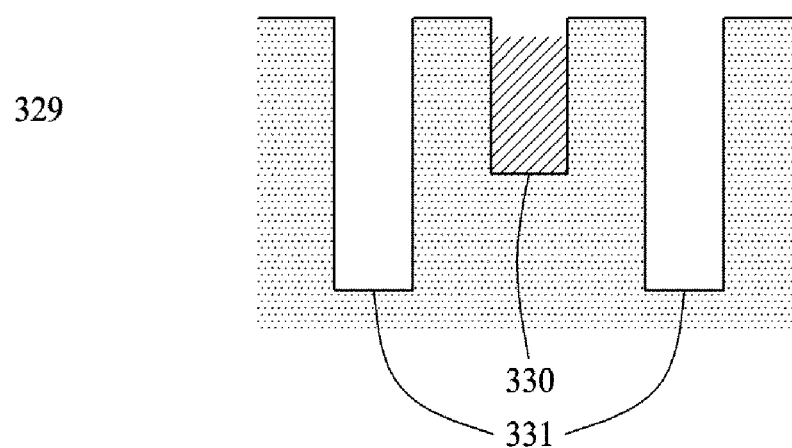

FIG. 3E
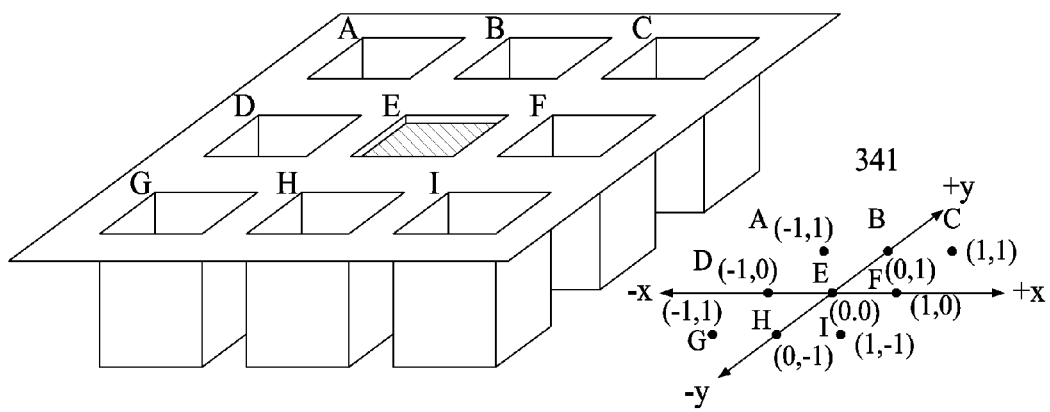
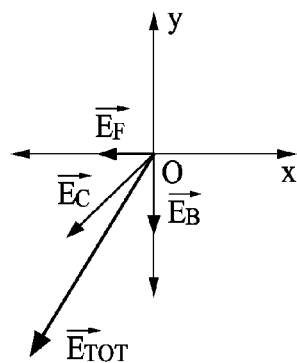

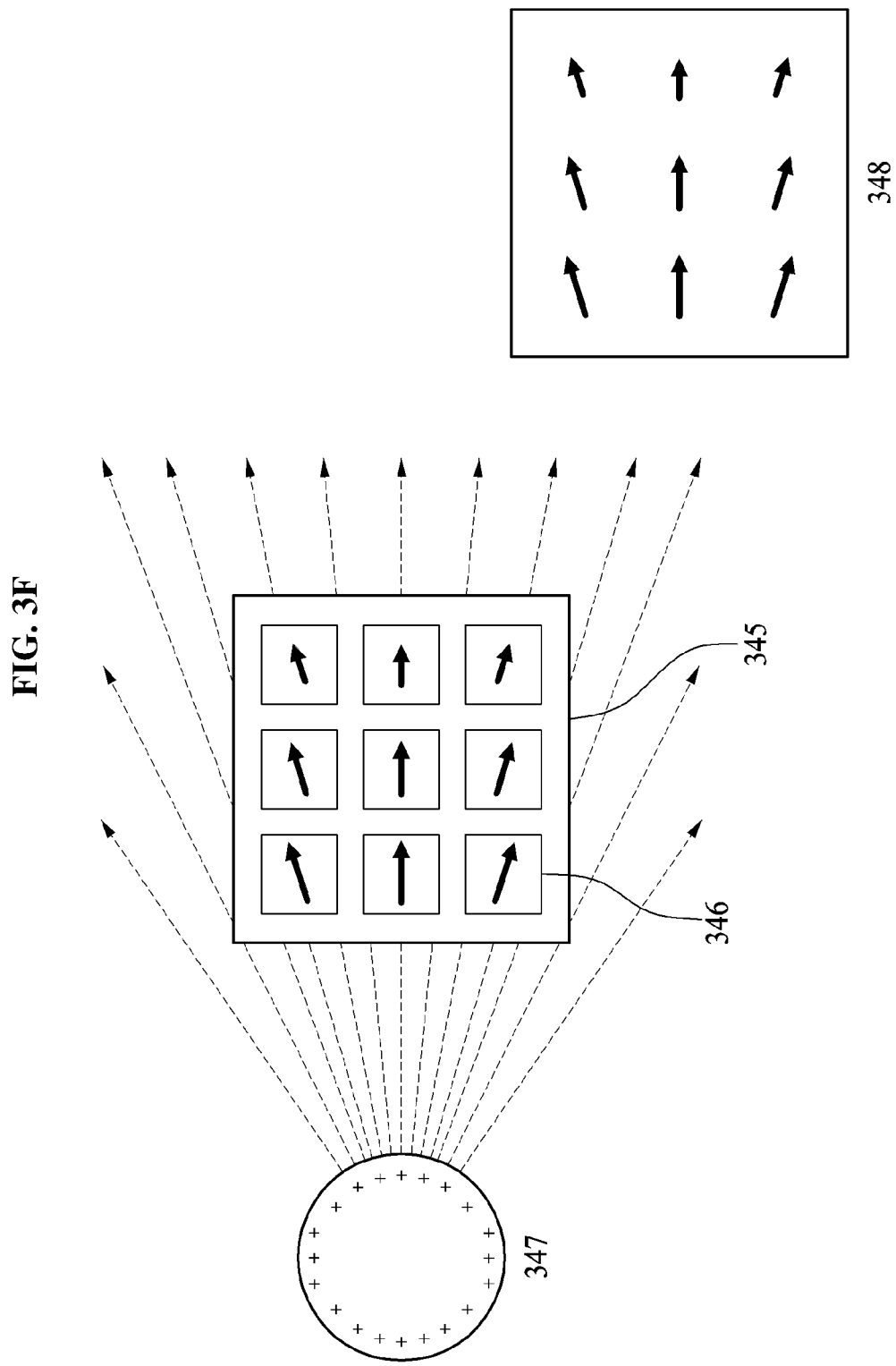

FIG. 4B
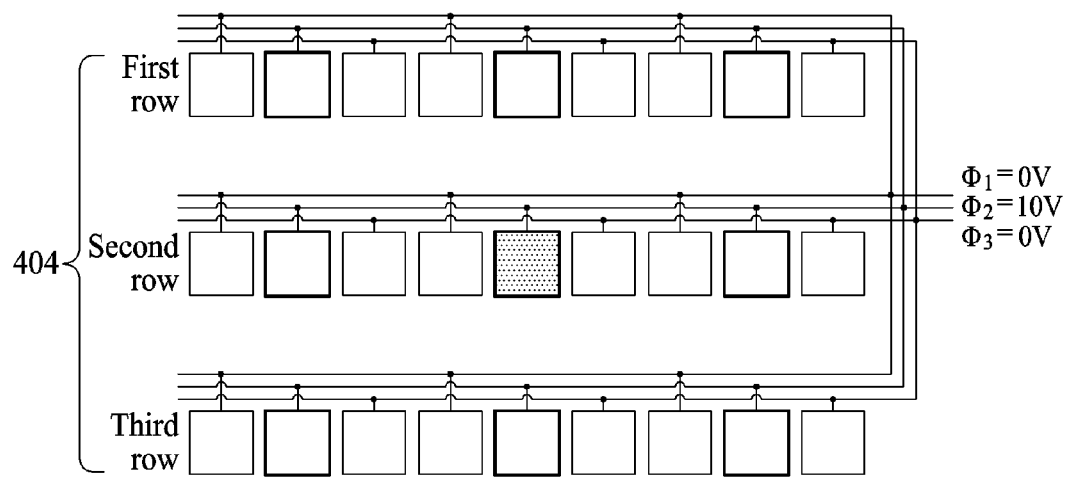
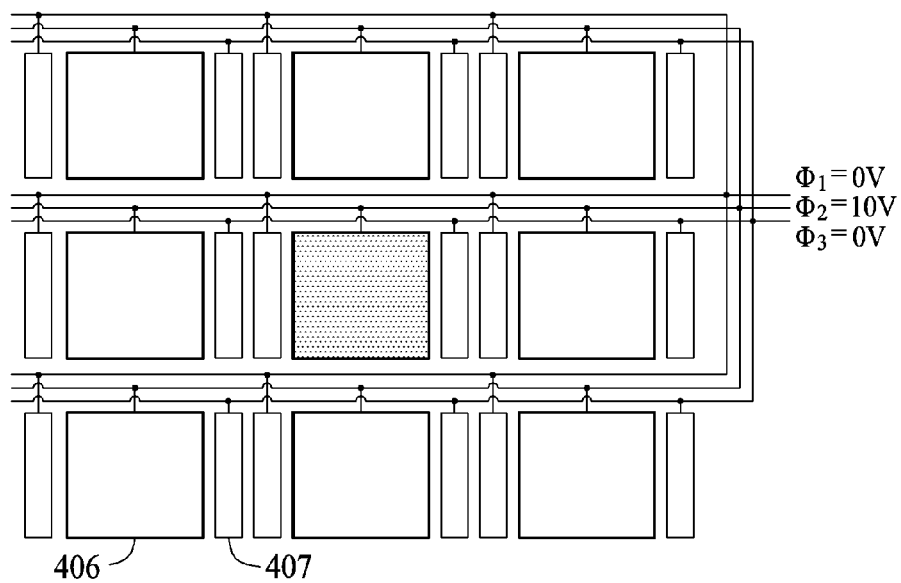

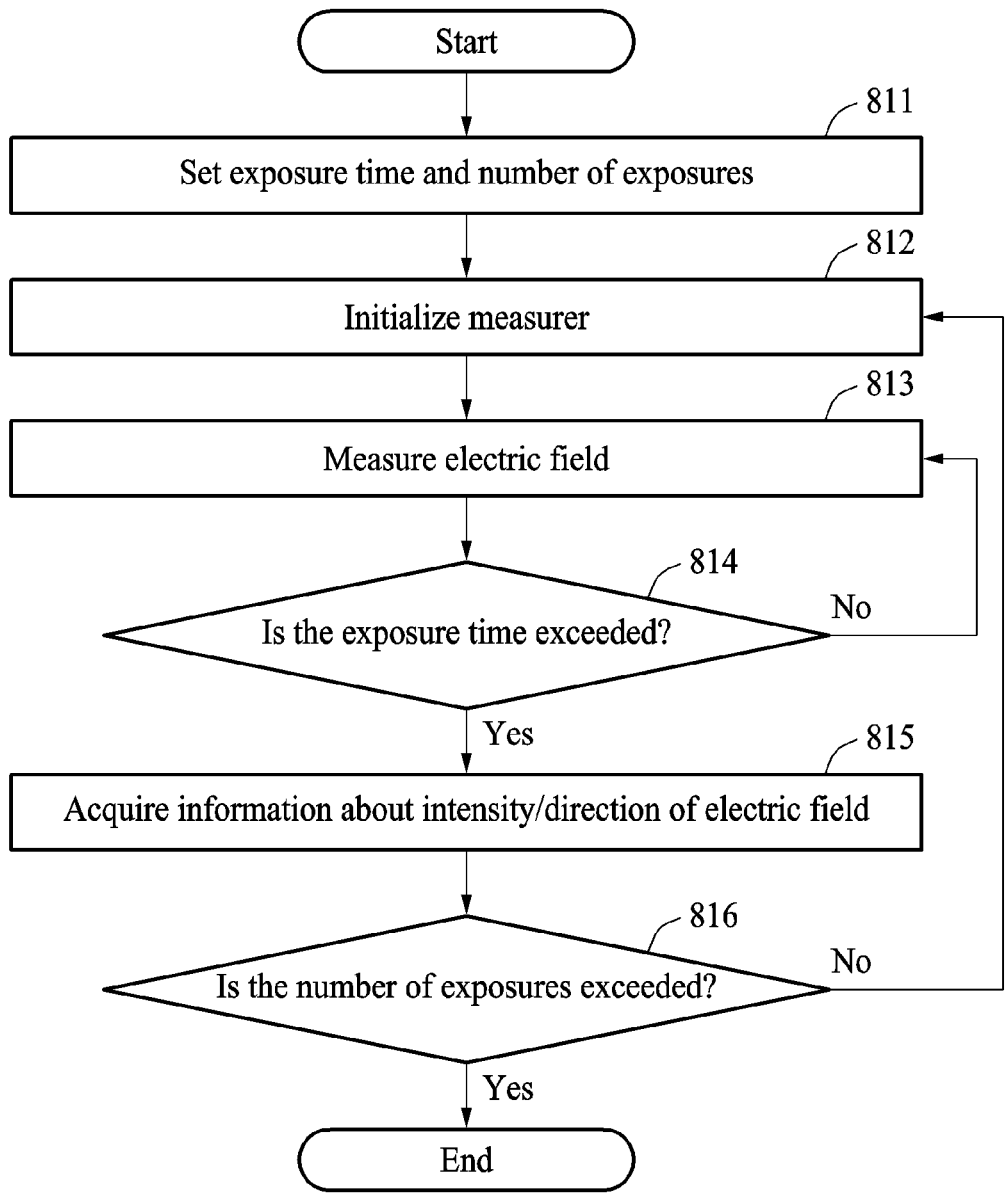

T₁: Initialization operation (Charge input and output voltage initialization) 900

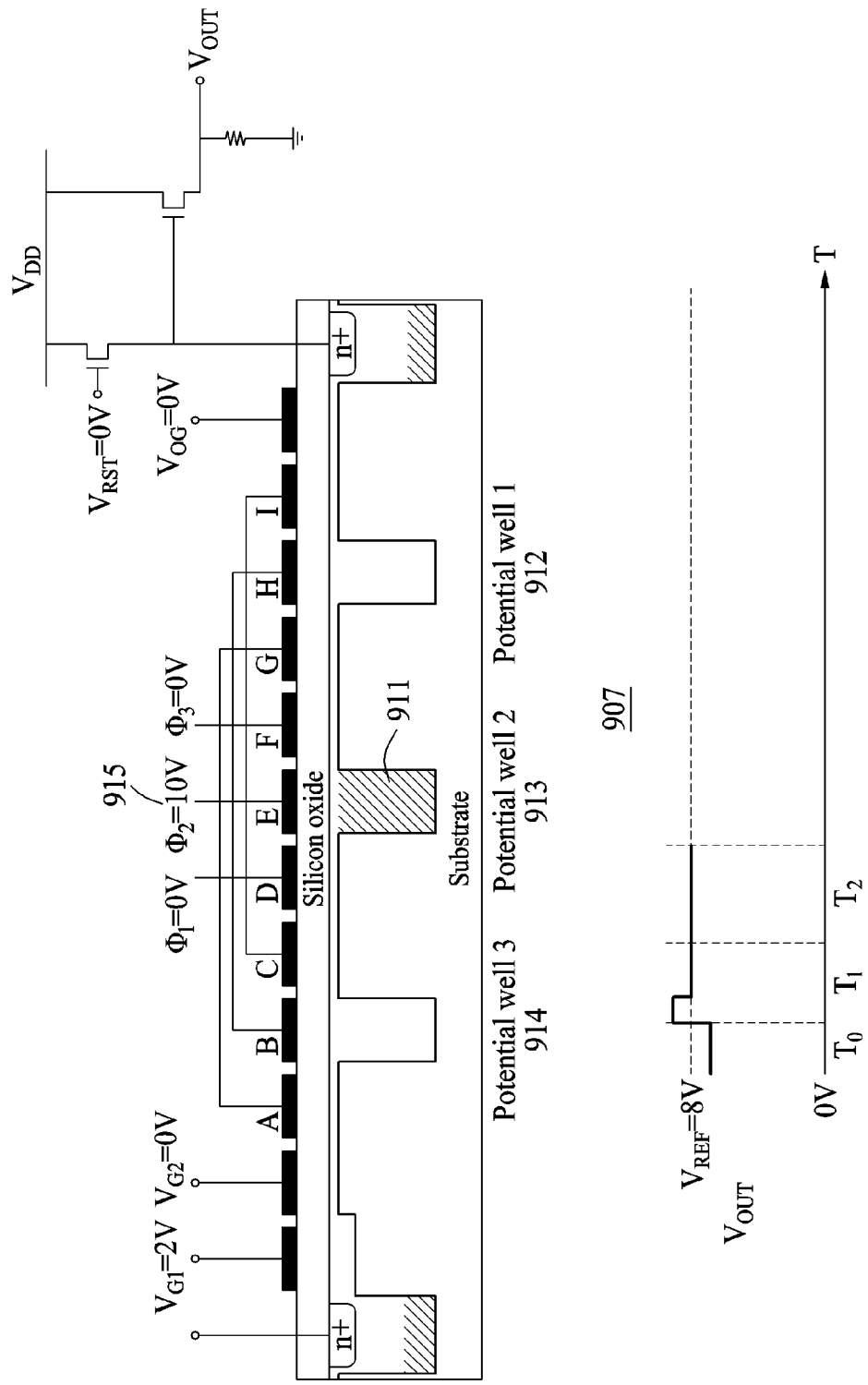

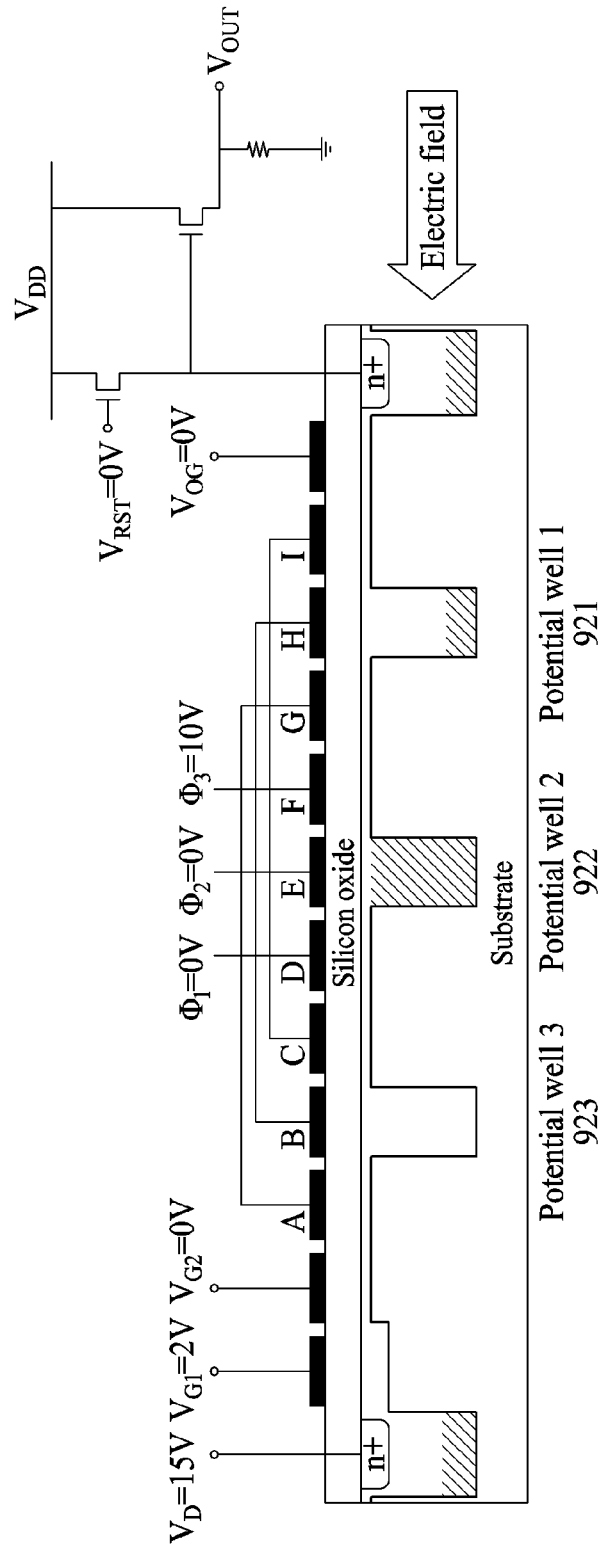
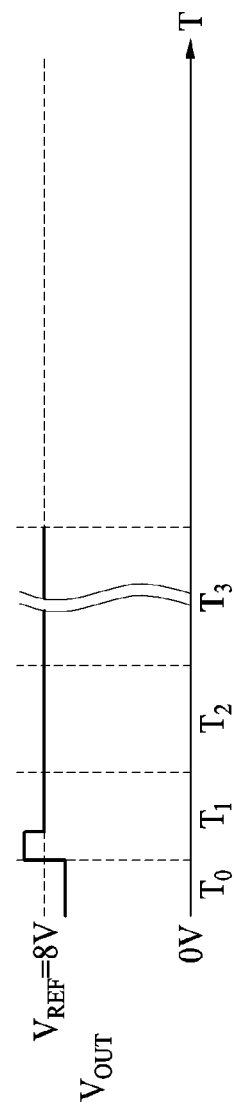
FIG. 9C

FIG. 9D
$T_4$ : Operation of acquiring information about intensity/direction of electric field 930
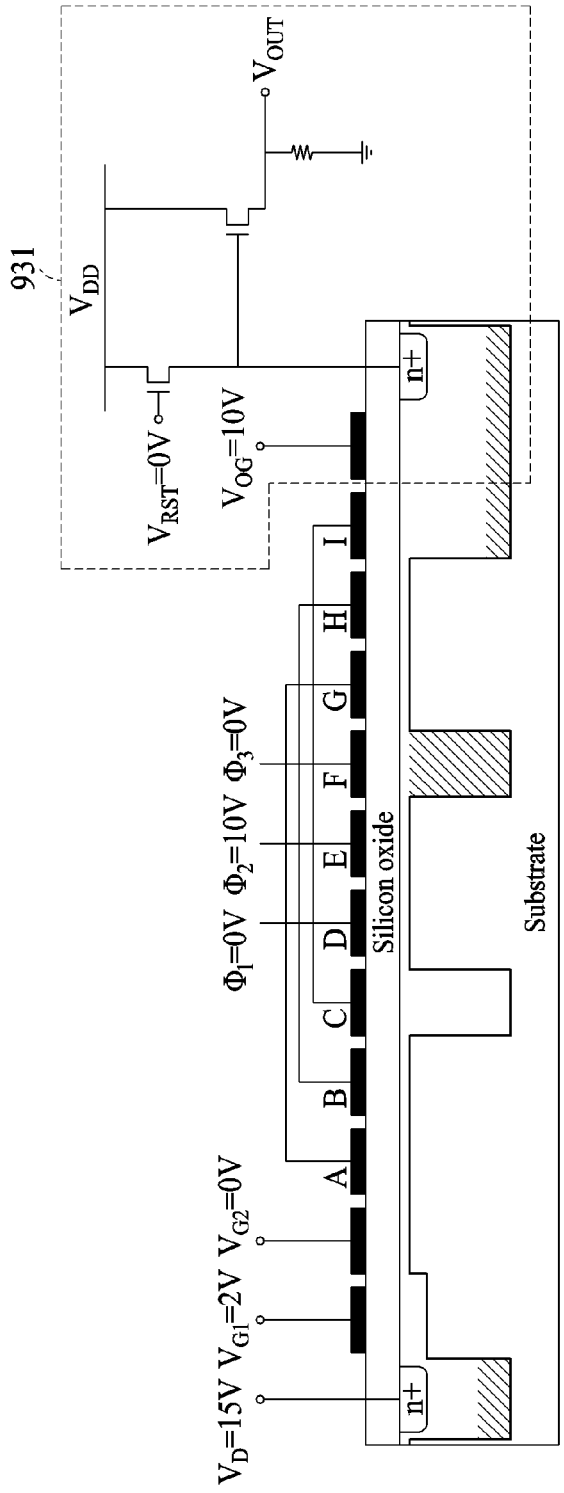
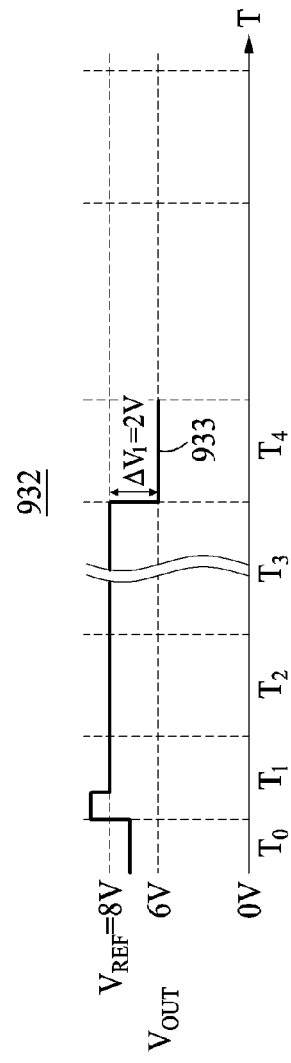

FIG. 9E
$T_5$, $T_6$: Operation of acquiring information about intensity/direction of electric field
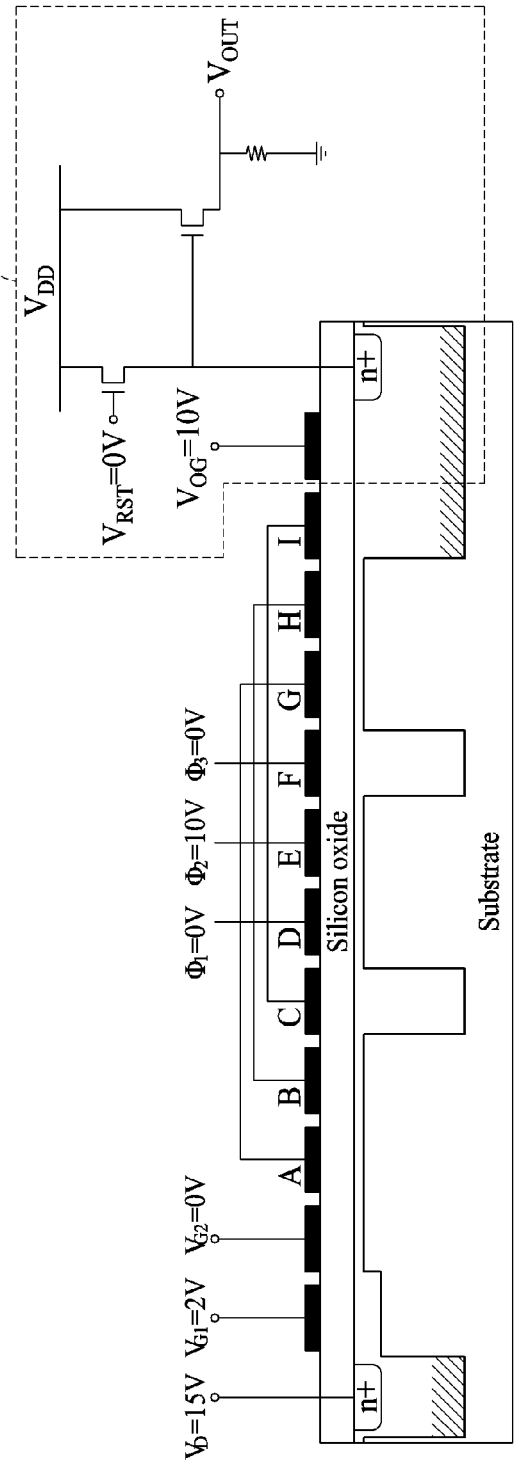
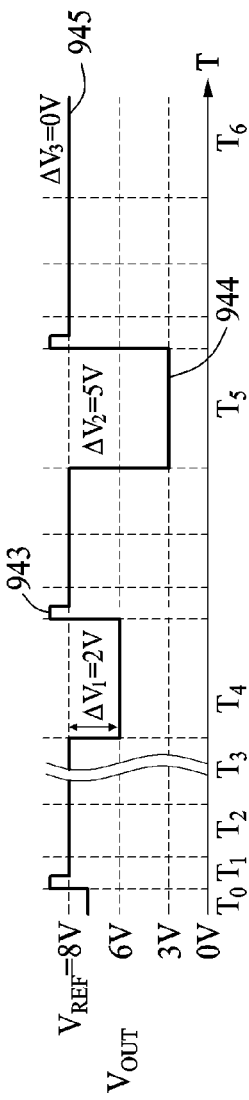
Operation of acquiring information about intensity/direction of electric field 942

DEVICE AND METHOD FOR MEASURING ELECTRIC FIELD BY USING MOS CAPACITOR

CROSS-REFERENCE TO RELATED APPLICATIONS

Under 35 U.S.C. 111(a), this application is a continuation of, claims the benefit of and priority to previously filed International Application Serial Number PCT/KR2015/007103 filed Jul. 9, 2015, entitled "DEVICE AND METHOD FOR MEASURING ELECTRIC FIELD BY USING MOS CAPACITOR", which claims priority to Korean Patent Application No. 10-2015-0006984, filed Jan. 14, 2015, which are hereby incorporated by reference in their entireties.

TECHNICAL FIELD

Example embodiments relate to a device and method for measuring an electric field using a metal-oxide-semiconductor (MOS) capacitor.

BACKGROUND ART

An electric field is associated with a scope of a force to move electric charges in a space and a distribution thereof and is a source of an electric force. The electric field is divided into an electrostatic field caused by electric charges collected in a specific position and a time-varying electromagnetic field caused by electromagnetic waves. The electrostatic field is determined by an amount of electric charges accumulated in a specific position, and accordingly does not change unless the amount of electric charges changes. The time-varying electromagnetic field is a time-dependent electric field that has a magnitude changed based on a waveform of a radio wave. Due to the above difference, the above electric fields are measured using different methods. To measure the electrostatic field, a method of measuring a potential difference between two electrodes is generally used. To measure the time-varying electromagnetic field, a method of measuring an induced current that flows via an antenna is used.

An importance and frequency of use of electric field measurement apparatuses are increasing due to a generation and applications of various electric fields, for example, a malfunction of electronic equipment due to electromagnetic leakage of electrical products and electronic components, an influence of use of various frequencies on a human body due to a development of a wireless communication technology, and a medical utilization such as a motion sensor using a body capacitance, a positron emission tomography (PET) or magnetic resonance imaging (MRI) which uses a body reaction due to external factors, electroencephalogram (EEG) and electrocardiogram (ECG).

However, since the electrostatic field and the time-varying electromagnetic field are different in a measurement principle from each other, measurement results of the electrostatic field and the time-varying electromagnetic field may be considerably constrained. For example, in a system using an alternating current (AC) and direct current (DC) at the same time, a combination of the electrostatic field and the time-varying electromagnetic field may have a great influence on a specific point in time, however, it is difficult to measure a magnitude of the above composite electric field using a general electric field measurement apparatus. Also, in an antenna that is a measurement apparatus used to measure the time-varying electromagnetic field, a band of a target frequency to be measured is generally fixed due to a shape of the antenna. Accordingly, a utilization of the antenna as a measurement apparatus may be inevitably reduced in a modern wireless communication environment.

In addition, an existing electric field measurement apparatus has a difficulty to measure a very weak electric field. For example, when a brain wave is measured, an intensity of an electric field emitted to the outside is extremely low, because a skull has an electric field shielding effect. Thus, an apparatus for measuring an electric field needs to include an amplifier, however, an amplification rate is limited at all times because noise generated in the amplifier becomes stronger as the amplification rate increases. Here, a circuit to distinguish a signal from noise is additionally required.

Moreover, the existing electric field measurement apparatus is generally incapable of measuring a direction of an electric field and has a characteristic that a measurement result of a magnitude of the electric field varies depending on a phase of a measurement apparatus. For example, when a phase of an antenna included in a measurement apparatus for measuring a time-varying electromagnetic field does not match a phase of an electromagnetic wave that causes a time-varying electromagnetic field, a magnitude of an induced current that flows through the antenna may decrease, and accordingly a magnitude of a measured electric field may be less than an actual magnitude. Thus, when a single sensor is used to measure an electric field, the electric field may need to be measured several times by slightly changing a phase of the sensor to accurately measure an intensity and direction of the electric field, and each of measurement results may need to be integrated and analyzed, which may cause an inconvenience.

DISCLOSURE OF INVENTION

Technical Subject

Example embodiments may provide a technology of measuring an intensity and direction of an electric field based on a phenomenon in which a portion of holes or electrons stored in a metal-oxide-semiconductor (MOS) capacitor flow out from the MOS capacitor and are recombined with a hole in a substrate, or flows into another MOS capacitor, when the MOS capacitor is exposed to the electric field.

Also, example embodiments may provide a technology of measuring an electrostatic field formed by static charges and a time-varying electromagnetic field formed by an electromagnetic wave using the same method, because an electric field is measured based on a degree of an inflow and/or outflow of electrons or holes.

In addition, example embodiments may provide a technology of measuring an electric field with an extremely low intensity by implementing a design to adjust a sensitivity based on an amount of electrons or holes stored in a MOS capacitor and a gate voltage applied to the MOS capacitor and to sense a change in an amount of electric charges stored in the MOS capacitor despite an extremely small amount of electrons or holes that flows into or flows out from the MOS capacitor.

Furthermore, example embodiments may provide a technology of simultaneously measuring an intensity and direction of an electric field using a plurality of MOS capacitors. Also, example embodiments may provide a technology of simultaneously measuring an intensity and direction of an electric field at several points in space using a plurality of MOS capacitors and of visualizing an electric field distribution by combining measurement results.

According to an aspect, an electric field measurement device using a single metal-oxide-semiconductor (MOS) capacitor includes a MOS capacitor exposed to an electric field, and a control unit configured to control the MOS capacitor so that information stored in the MOS capacitor is changed by the electric field.

The information stored in the MOS capacitor may include an amount of electric charges (for example, electrons or holes) stored in the MOS capacitor. The MOS capacitor may be configured to store electric charges in a substrate region of the MOS capacitor based on a gate voltage applied to a gate electrode of the MOS capacitor.

The control unit may be configured to control a gate voltage applied to the MOS capacitor so that the information stored in the MOS capacitor is changed by the electric field.

An intensity of the electric field may be calculated based on a difference between an amount of electric charges stored in advance in the MOS capacitor before the MOS capacitor is exposed to the electric field and an amount of electric charges stored in the MOS capacitor after the MOS capacitor is exposed to the electric field.

A sensitivity to a change in the amount of electric charges stored in the MOS capacitor may be determined based on at least one of a gate voltage applied to the MOS capacitor or the amount of electric charges stored in advance in the MOS capacitor.

The electric field measurement device may further include an input circuit configured to supply electric charges stored in the MOS capacitor.

The input circuit may include an input diode configured to supply an electric charge that is to be input to the MOS capacitor, and an input gate configured to control a supply of the electric charge from the input diode.

The input diode may be configured with a PN junction or a Schottky junction. The input gate may be configured in a form of a MOS capacitor.

The control unit may be configured to control the input circuit so that initialization information is stored in a form of an electric charge in the MOS capacitor before the MOS capacitor is exposed to the electric field.

The electric field measurement device may further include an output circuit configured to output an electric charge stored in the MOS capacitor.

The output circuit may include an output diode configured to convert the electric charge stored in the MOS capacitor to an electric signal, and an output gate configured to control a movement of an electric charge from the MOS capacitor to the output diode.

The output diode may be configured with a PN junction or a Schottky junction. The output gate may be configured in a form of a MOS capacitor.

The control unit may be configured to control the output circuit to output the electric charge stored in the MOS capacitor as an electric signal after the MOS capacitor is exposed to the electric field.

According to another aspect, an electric field measurement device using a plurality of MOS capacitors includes a measurer including a plurality of MOS capacitors, and a control unit configured to control the measurer so that information stored in at least one MOS capacitor among the plurality of MOS capacitors is changed by an electric field.

The measurer including the plurality of MOS capacitors may use at least one MOS capacitor among the plurality of MOS capacitors as a measuring unit to measure an intensity and direction of an electric field, and may include at least one measuring unit.

The measuring unit may include at least one first MOS capacitor, and may further include second MOS capacitors located around the first MOS capacitor.

When the measuring unit is exposed to an electric field, an electric charge stored in the first MOS capacitor may be moved by the electric field to at least one second MOS capacitor.

An intensity of an electric field measured by the measuring unit may be calculated based on at least one of an amount of electric charges flowing out from the first MOS capacitor or an amount of electric charges flowing into the second MOS capacitors.

A direction of an electric field measured by the measuring unit may be calculated based on a position of at least one second MOS capacitor into which electric charges are introduced from the first MOS capacitor, and an amount of electric charges flowing into the at least one second MOS capacitor.

The control unit may be configured to control gate voltages applied to the MOS capacitors so that an electric charge released from the first MOS capacitor is introduced by the electric field into at least one of the second MOS capacitors.

A sensitivity to an outflow of an electric charge stored in the first MOS capacitor may be determined based on at least one of a gate voltage applied to the first MOS capacitor or an amount of electric charges stored in the first MOS capacitor.

A sensitivity to an inflow of electric charges into the at least one second MOS capacitor may be determined based on at least one of a gate voltage applied to the second MOS capacitor or an amount of electric charges stored in the second MOS capacitor.

The measurer including the plurality of MOS capacitors may include a plurality of measuring units, and may be configured to measure an electric field simultaneously at a plurality of positions using the plurality of measuring units.

The electric field measurement device may further include at least one input circuit configured to supply electric charges stored in the first MOS capacitor included in the measurer and second MOS capacitors.

The input circuit may include an input diode configured to supply electric charges that are to be input to the first MOS capacitor and the second MOS capacitors, and an input gate configured to control a supply of electric charges from the input diode.

The input diode may be configured with a PN junction or a Schottky junction. The input gate may be configured in a form of a MOS capacitor.

The control unit may be configured to control the input circuit so that initialization information is stored in a form of an electric charge in the first MOS capacitor and the second MOS capacitors before the first MOS capacitor and the second MOS capacitors are exposed to the electric field.

The control unit may be configured to sequentially control gate voltages of neighboring MOS capacitors between the input circuit and the first MOS capacitor so that an electric charge input through the input circuit is moved to the first MOS capacitor.

The control unit may be configured to sequentially control gate voltages of neighboring MOS capacitors between the input circuit and one second MOS capacitor among the second MOS capacitors so that an electric charge input through the input circuit is moved to the second MOS capacitor.

The input circuit may further include an input register configured to temporarily store an electric charge input through the input circuit before the input electric charge is moved to the first MOS capacitor or one of the second MOS capacitors. The input register may be configured in a form of a MOS capacitor.

The control unit may be configured to sequentially control gate voltages applied to the input circuit and the input register so that the electric charge input through the input circuit is stored in the input register before the input electric charge is moved to the first MOS capacitor or one of the second MOS capacitors.

The control unit may be configured to sequentially control gate voltages applied to the input register and the MOS capacitors so that the electric charge stored in the input register is moved to the first MOS capacitor or one of the second MOS capacitors.

The electric field measurement device may further include at least one output circuit configured to output electric charges stored in the MOS capacitors.

The output circuit may include an output diode configured to convert electric charges stored in the MOS capacitors to an electric signal, and an output gate configured to control a movement of electric charges from the MOS capacitor to the output diode.

The output diode may be configured with a PN junction or a Schottky junction. The output gate may be configured in a form of a MOS capacitor.

The control unit may be configured to control the output circuit to output an electric charge stored in the MOS capacitor as an electric signal after the MOS capacitor is exposed to the electric field.

The control unit may be configured to sequentially control gate voltages of neighboring MOS capacitors between the first MOS capacitor and the output circuit so that an electric charge stored in the first MOS capacitor is moved to the output circuit.

The control unit may be configured to sequentially control gate voltages of neighboring MOS capacitors between the output circuit and at least one second MOS capacitor so that electric charges stored in the first MOS capacitor are moved to the output circuit.

The output circuit may further include at least one output register configured to temporarily store electric charges that are to be output, before electric charges stored in the first MOS capacitor or at least one of the second MOS capacitors are output through the output circuit. The output register may be configured in a form of a MOS capacitor.

The control unit may be configured to sequentially control gate voltages applied to the MOS capacitors and the output register so that the electric charges stored in the first MOS capacitor or at least one of the second MOS capacitors are stored in the output register before the electric charges move to the output circuit.

The control unit may be configured to sequentially control gate voltages applied to the output register and the output circuit so that electric charges stored in the output register are moved to the output circuit.

The measurer may include a substrate formed of a semiconductor material, an insulating material laminated on the substrate, and gate electrodes laminated on the insulating material.

The gate electrodes may be arranged on the insulating material in one-dimension (1D) or two-dimension (2D).

At least a portion of the gate electrodes may have a different shape from the other gate electrodes.

The gate electrodes may be electrically connected to the control unit, and the control unit may be configured to control gate voltages applied to the gate electrodes to control electric potential energy distributed on the substrate.

A portion of the gate electrodes may be connected to one of a predetermined number of phase lines. The control unit may be configured to simultaneously apply the same gate voltage to a plurality of gate electrodes connected to the same phase line.

According to another aspect, an electric field measurement method using a MOS includes initializing an electric field measurement device by storing first information in at least one MOS capacitor included in the electric field measurement device before the at least one MOS capacitor is exposed to an electric field, controlling the at least one MOS capacitor in which the first information is stored, to measure the electric field, receiving second information stored in the at least one MOS capacitor after the at least one MOS capacitor is exposed to the electric field, and acquiring at least one of information associated with an intensity of the electric field or information associated with a direction of the electric field based on the first information and the second information.

The first information may be initialization information and may include an amount of electric charges stored in the at least one MOS capacitor to initialize the at least one MOS capacitor.

The second information may include an amount of electric charges stored in the at least one MOS capacitor after the at least one MOS capacitor is exposed to the electric field.

The initializing may include determining the first information and a gate voltage that is to be applied to the MOS capacitors based on at least one of a sensitivity to an outflow of an electric charge stored in the at least one MOS capacitor due to the electric field or an inflow of the electric charge flowing out from the at least one MOS capacitor into at least one other MOS capacitor.

The initializing may further include setting an exposure time in which the at least one MOS capacitor is to be exposed to an electric field, and a number of exposures of the at least one MOS capacitor to an electric field.

The controlling may include controlling a gate voltage of the MOS capacitors so that initialization information input to the MOS capacitors during the initializing is changed by the electric field.

The electric field measurement method may further include determining whether an end condition of an electric field measurement is satisfied, based on an exposure time and a number of exposures that are set during the initializing.

When the end condition is determined to be satisfied, a gate voltage applied to the MOS capacitors may be controlled so that information stored in the MOS capacitor remains unchanged.

The electric field measurement device further may include a shielding device configured to shield the MOS capacitor from an electric field. When the end condition is determined to be satisfied, the shielding device may be controlled to shield the MOS capacitor from the electric field.

The acquiring may include at least one of calculating the intensity of the electric field based on the first information, the second information and a gate voltage applied to the at least one MOS capacitor, or calculating the direction of the electric field based on the first information and the second information.

The electric field measurement method may further include comparing an actual number of exposures to a number of exposures to an electric field that is set during the initializing, and repeatedly performing the initializing and the controlling when a result of the comparing indicates that the actual number of exposures is less than the set number of exposures.

According to another aspect, an electric field measurement method includes receiving first information stored in at least one MOS capacitor before the at least one MOS capacitor is exposed to an electric field, receiving second information stored in the at least one MOS capacitor after the at least one MOS capacitor is exposed to the electric field, and acquiring at least one of information associated with an intensity of the electric field or information associated with a direction of the electric field based on the first information and the second information.

The first information may include an amount of electric charges stored in the at least one MOS capacitor when the at least one MOS capacitor is initialized.

At least a portion of electric charges stored the at least one MOS capacitor may be released due to an exposure to the electric field, and the second information may include an amount of electric charges remaining in the at least one MOS capacitor after the at least one MOS capacitor is exposed to the electric field.

The acquiring may include at least one of calculating the intensity of the electric field based on the first information, the second information and a gate voltage applied to the at least one MOS capacitor, or calculating the direction of the electric field based on the first information and the second information.

BRIEF DESCRIPTION OF DRAWINGS

FIGS. 2A through 2C are diagrams illustrating a basic structure of a measurer included in an electric field measurement device using a MOS capacitor according to an example embodiment.

FIGS. 3A through 3F are diagrams illustrating an electric field measurement principle of an electric field measurement device using a MOS capacitor according to an example embodiment.

FIGS. 4A and 4B are diagrams illustrating a method of implementing a measurer of an electric field measurement device using MOS capacitors according to an example embodiment.

FIGS. 8A and 8B are flowcharts illustrating an electric field measurement method using a MOS capacitor according to an example embodiment.

FIGS. 9A through 9E are diagrams illustrating a type of an output voltage and a change in an amount of electric charges in a measurer for each of operations included in an electric field measurement method using a MOS capacitor according to an example embodiment.

BEST MODE FOR CARRYING OUT THE INVENTION

Hereinafter, example embodiments will be described in detail with reference to the accompanying drawings.

Figure 1:
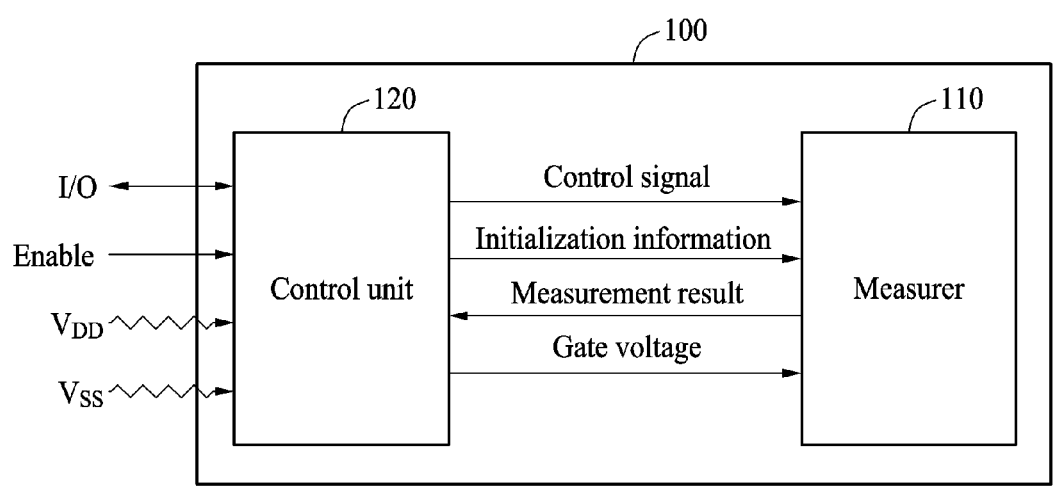
FIG. 1 is a block diagram illustrating an electric field measurement device using a metal-oxide-semiconductor (MOS) capacitor according to an example embodiment.

FIG. 1 is a block diagram illustrating an electric field measurement device using a metal-oxide-semiconductor (MOS) capacitor according to an example embodiment. Referring to FIG. 1, an electric field measurement device 100 includes a measurer 110 and a control unit 120.

The measurer 110 may include at least one MOS capacitor, and may store information using the at least one MOS capacitor. The information stored in the measurer 110 may include an amount of electric charges stored in the MOS capacitor, and the electric charges may include, for example, negative charges associated with electrons, positive charges associated with holes, and a combination thereof.

Also, the measurer 110 may store initialization information received from the control unit 120 in the at least one MOS capacitor included in the measurer 110. To this end, the electric field measurement device 100 may include a circuit configured to convert the initialization information received from the control unit 120 to an amount of electric charges to be stored in the MOS capacitor.

The information stored in the measurer 110 may be changed by an electric field radiated to the measurer 110. For example, electric charges stored in the at least one MOS capacitor in the measurer 110 may be released due to an electric field. Also, the electric charges released due to the electric field may flow into another MOS capacitor. Here, a sensitivity to an outflow of electric charges from a MOS capacitor due to an electric field may depend on a magnitude of a gate voltage applied to the MOS capacitor and an amount of electric charges stored in the MOS capacitor.

Also, the measurer 110 may transmit a measurement result obtained after an exposure to the electric field to the control unit 120. To this end, the electric field measurement device 100 may include a circuit configured to convert an amount of electric charges stored in a MOS capacitor in the measurer 110 to an electric signal, for example, a voltage or current.

The electric field measurement device 100 may compare the initialization information that is input to the measurer 110 before the measurer 110 is exposed to the electric field to the measurement result output from the measurer 110 after the measurer 110 is exposed to the electric field, to measure an intensity and direction of the electric field.

The electric field measurement device 100 may measure the intensity and direction of the electric field based on only a change in an amount of electric charges stored in the MOS capacitor, and thus it is possible to measure a comprehensive influence of the electric field regardless of a type of electric fields. For example, the electric field measurement device 100 may measure both inflow outflow effects of electric charges due to an electrostatic field formed by static charges and a time-varying electromagnetic field formed by electromagnetic waves. In an example of the time-varying electromagnetic field, the electric field measurement device 100 may determine a distribution of electric fields generated in all frequency bands based on a change in an amount of electric charges in a MOS capacitor, unlike a general electric field measurement device that determines a measurable frequency band based on a physical characteristic of an antenna.

The control unit 120 may control the measurer 110 to measure an electric field. The control unit 120 may control the measurer 110 to measure or not to measure the electric field based on an enable signal received from the outside, and may generate a gate voltage that is to be applied to the at least one MOS capacitor in the measurer 110 by receiving an input of $V_{DD}$ and $V_{SS}$ from the outside. Also, the control unit 120 may generate the initialization information and a control signal that are to be transmitted to the measurer 110, based on an I/O signal received from the outside, and may output the measurement result received from the measurer 110 to the outside through the I/O signal.

Figure 2A:
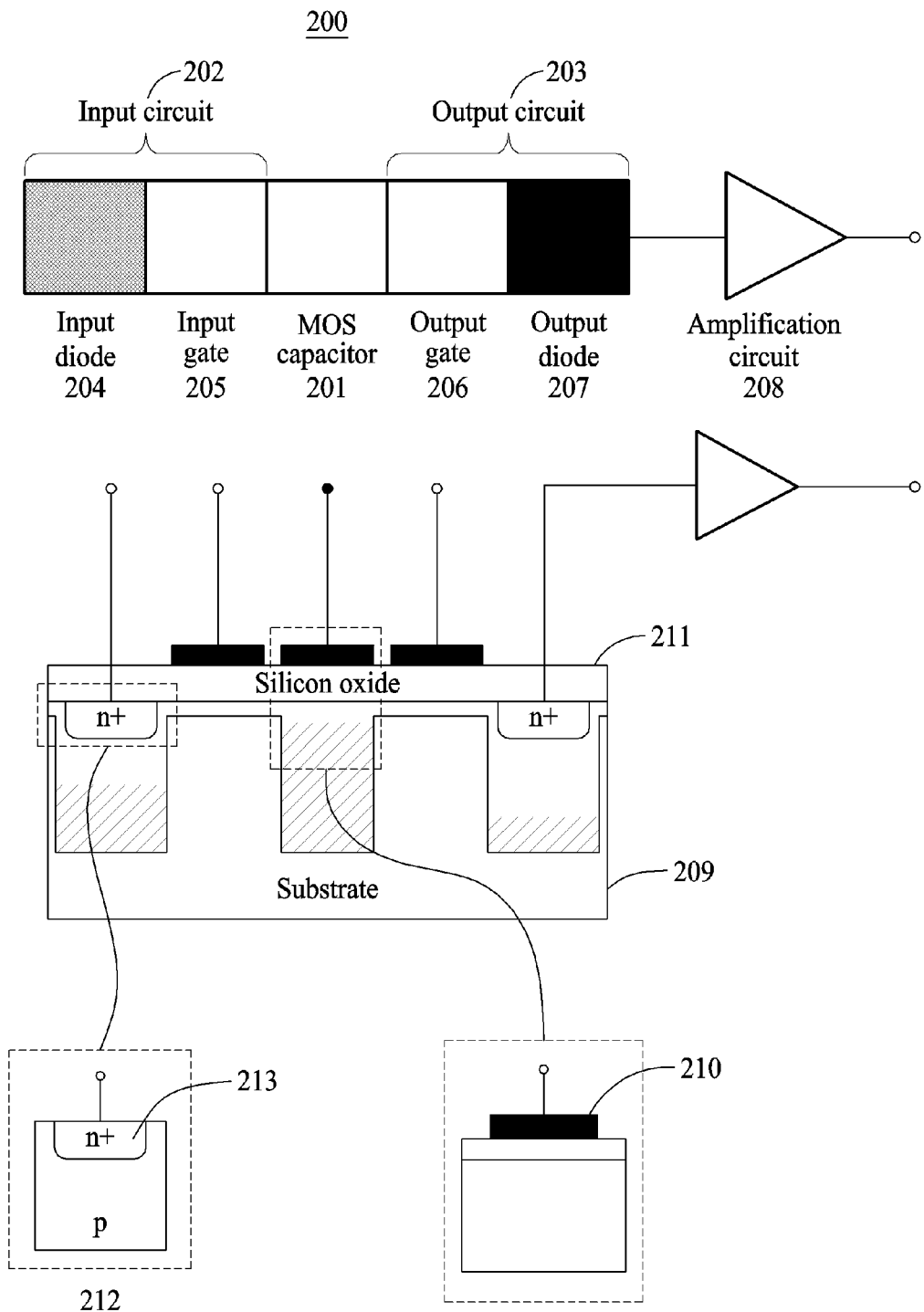
Figure 2C:
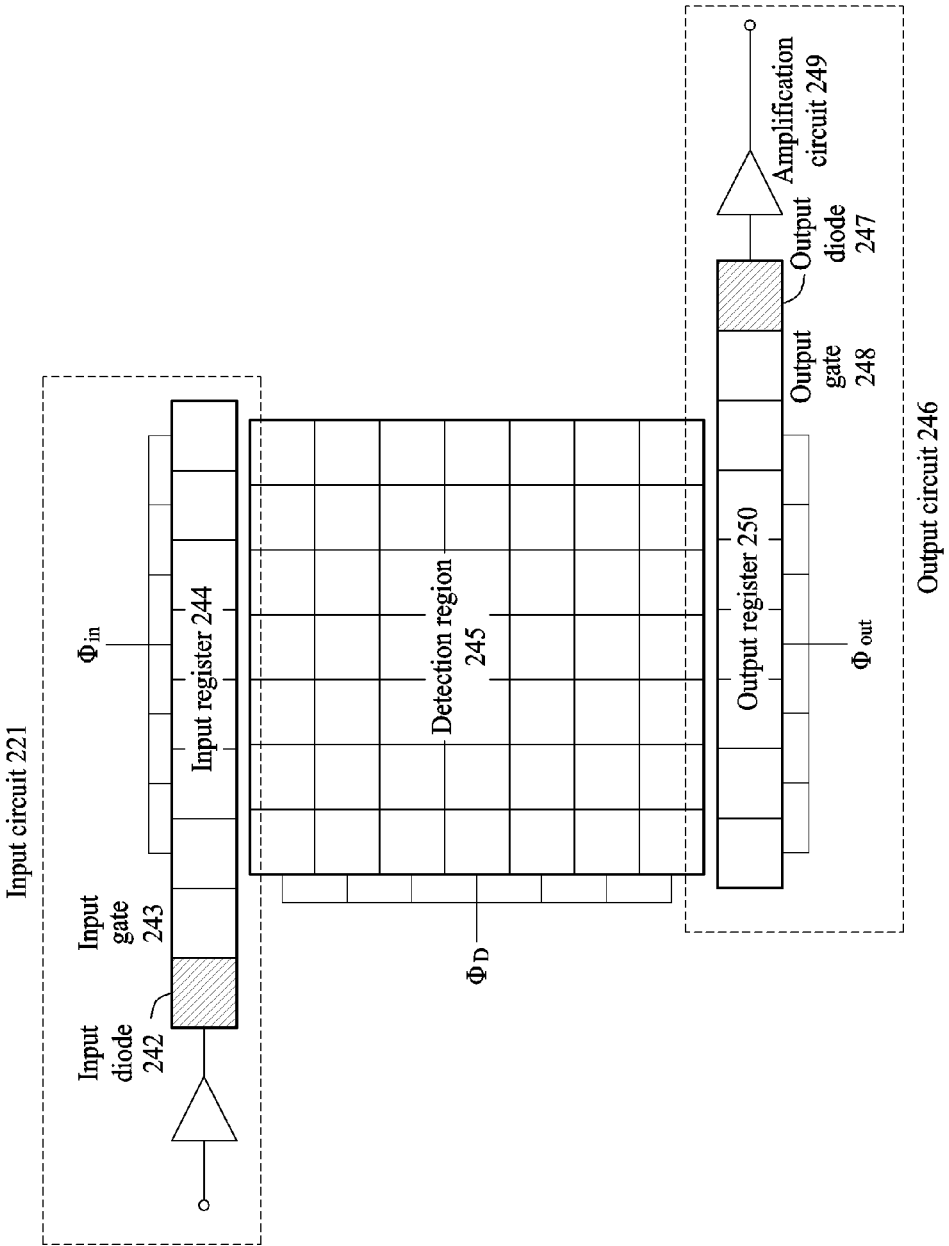

FIGS. 2A through 2C are diagrams illustrating a basic structure of a measurer included in an electric field measurement device using a MOS capacitor according to an example embodiment.

FIG. 2A illustrates a measurer 200 of an electric field measurement device using a single MOS capacitor according to an example embodiment. Referring to FIG. 2A, the measurer 200 of the electric field measurement device using a single MOS capacitor may include a MOS capacitor 201 disposed on a substrate 209 formed of a semiconductor material, an input circuit 202 configured to input initialization information to the MOS capacitor 201, and an output circuit 203 configured to output a measurement result after an exposure to an electric field.

The substrate 209 of the measurer 200 is generally formed using silicon, and semiconductor material, for example, gallium-arsenide or germanium, may also be used to form a substrate. Also, the substrate 209 may be formed for an N-type semiconductor that uses electrons as majority carriers, a P-type semiconductor that uses holes as majority carriers, or a combination thereof. Since a substrate is generally manufactured for a P-type semiconductor, the measurer 200 will be described below based on an example of a substrate manufactured for a P-type semiconductor, however, there is not limitation thereto. Accordingly, in another example, a measurer may be implemented by using a substrate manufactured for an N-type semiconductor or by combining an N-type semiconductor in a P-type semiconductor. In this example, a measurement principle and physical structure applied to the above example may equally be applicable.

The MOS capacitor 201 may include a gate electrode 210 and a silicon oxide 211 laminated on the above-described substrate 209. The gate electrode 210 may be formed of a metal material such as aluminum or tungsten, or a material such as polysilicon into which an ion is injected with a high concentration, and the silicon oxide may be replaced by an insulating material such as a silicon nitride having a similar physical characteristic. The MOS capacitor 201 may store electric charges in a region of the substrate 209 using a gate voltage applied to the gate electrode 210. Electric charges moved in a direction of the gate electrode 210 by the gate voltage may not be moved anymore due to the silicon oxide 211 laminated on the substrate 209 and may be confined onto the substrate 209. A maximum amount of electric charges capable of being stored in the MOS capacitor 201 may be proportional to a magnitude of the gate voltage applied to the gate electrode 210, and electric charges stored in the MOS capacitor 201 may be electrons or holes based on a type of semiconductor materials of the substrate 209 or a polarity of a voltage applied to the gate electrode 210.

In an example, it may be assumed that a P-type semiconductor is used as the substrate 209 in the measurer 200. In this example, an amount of electric charges stored in the MOS capacitor may be determined by a number of negative charges, that is, electrons. Accordingly, electric charges stored in a MOS capacitor that will be described below may have the same meaning as electros stored in the MOS capacitor. In another example, in a measurer that uses an N-type semiconductor material as a substrate, an amount of electric charges stored in a MOS capacitor may be determined by a number of positive charges, that is, holes.

The electric field measurement device may measure an intensity of an electric field based on a change in an amount of electric charges stored in the MOS capacitor 201. Referring to FIG. 2A, the electric field measurement device using the MOS capacitor 201 may store electrons in the region of the substrate 209 of the MOS capacitor 201 using the gate voltage applied to the gate electrode 210 of the MOS capacitor 201, and may enable an inflow and/or outflow of electrons due to an electric field radiated from the outside. For example, when a gate voltage of 10 V is applied to the MOS capacitor 201, electric potential energy below the MOS capacitor 201 may be reduced, and a distribution of electric potential energy in the substrate 209 may change. A region in which the electric potential energy is reduced may be used to store electric charges. For example, when electric charges are assumed to be input to the MOS capacitor 201 in advance, a portion of electric charges stored in the MOS capacitor 201 may be released from the MOS capacitor 201 due to the electric field. In this example, an amount of electric charges released from the MOS capacitor 201 may depend on an intensity of the electric field. As described above, the intensity of the electric field may be measured based on a change in an amount of electric charges in the MOS capacitor 201.

The input circuit 202 may be a circuit configured to convert an input electric signal to electric charges to be stored in the MOS capacitor 201. The input circuit 201 may include at least one input diode 204 and at least one input gate 205. In FIG. 2A, the input diode 204 of the input circuit 202 may have a PN junction 212 and may function to supply electrons to the MOS capacitor 201. The PN junction 212 indicates a junction in which an N-type semiconductor 213 is joined on the substrate 209 formed of a P-type semiconductor material.

The input gate 205 may be configured in a form of a MOS capacitor, and may function to control an amount of electrons supplied to the MOS capacitor 201 through the input diode 204. A configuration and operation principle of an input circuit will be further described with reference to FIG. 5 below.

The output circuit 203 may be a circuit configured to convert an electric charge stored in the MOS capacitor 201 to an electric signal. The output circuit 203 may include an output diode 207, an output gate 206, and an amplification circuit 208 configured to amplify an output signal from the output diode 207. The output diode 207 may have the PN junction 212 similarly to the input diode 204, and may function to output an electron stored in the MOS capacitor 201 as an electric signal such as a voltage. Similarly to the input gate 204, the output gate 206 may be configured in a form of a MOS capacitor, and may function to control a movement of electrons from the MOS capacitor 201 to the output diode 207. A configuration and operation principle of an output circuit will be further described with reference to FIG. 6 below.

According to an example embodiment, an electric field measurement device may include a measurer using an N-type semiconductor material as a substrate. Here, a PN junction may be formed of a P-type semiconductor material that is joined on the substrate, and may be used to supply a hole to a MOS capacitor included in the measurer or to output a hole stored in the MOS capacitor to the outside.

Also, an input circuit 202 and an output circuit 203 of the electric field measurement device may include an input diode 204 and an output diode 207 with a metal-semiconductor junction called a "Schottky junction" instead of the PN junction 212. Here, a configuration and operation principle of each of the input circuit 203 and the output circuit 204 may remain the same as those of the electric field measurement device using the PN junction 212. Thus, the same result as a result obtained by using the PN junction may be obtained even though description of a PN junction is replaced by a Schottky junction.

In addition, because a structure, for example, a PN junction and MOS capacitor, is used in both the input circuit 202 and the output circuit 203, two circuits may be integrated into a single input/output circuit. Here, the operation principle of each of the input circuit 203 and the output circuit 204 and an electric field measurement method based on the operation principle may also remain the same.

FIG. 2B is a diagram illustrating a measurer 220 of an electric field measurement device using a plurality of MOS capacitors according to an example embodiment. Referring to FIG. 2B, the measurer 220 of the electric field measurement device for measuring an intensity and direction of an electric field in 1D may include a detection region 221 including at least one MOS capacitor located on a substrate that is formed of a semiconductor material, an input circuit 222 configured to input an electric charge to the at least one MOS capacitor in the detection region 221, and an output circuit 223.

The detection region 221 of the measurer 220 may be configured by arranging the at least one MOS capacitor on the substrate. Referring to FIG. 2B, the detection region 221 of the measurer 220 may be configured by arranging nine MOS capacitors, for example, a MOS capacitor A through a MOS capacitor I, in a line, to measure the intensity and direction of the electric field in 1D. When gate voltages are applied to the MOS capacitors arranged in 1D, a distribution of electric potential energy on the substrate may change, which may be used to store electrons in the MOS capacitors and to enable an inflow and/or outflow of electrons due to an electric field radiated from the outside. Here, a circuit to apply a gate voltage to the MOS capacitors in the detection region 221 may be designed to individually apply a gate voltage to each of the MOS capacitors or designed to simultaneously apply gate voltages to a plurality of MOS capacitors.

Referring to FIG. 2B, each of a plurality of MOS capacitors included in the detection region 221 of the measurer 220 may be connected one of three phase lines 230, and voltages applied to the phase lines 230 may be simultaneously applied to the plurality of MOS capacitors that share the phase lines 230. For example, when a voltage of 10 V is applied to a line Φ2, a gate voltage of 10V may be applied to a MOS capacitor B 232, a MOS capacitor E 231 and a MOS capacitor H 233 that are connected to the line Φ2. Accordingly, a distribution of electric potential energy on the substrate may change. In this example, when electric charges are assumed to be input to the MOS capacitor E 231 in advance, a portion of electric charges stored in the MOS capacitor E 231 may be released due to an electric field radiated to the detection region 221. The released electric charges may flow into the MOS capacitor B or the MOS capacitor H 233. An amount of electric charges released from the MOS capacitor E 231 may depend on an intensity of the electric field in a position occupied by the MOS capacitor E 231 in the detection region 221. Similarly, a direction of a MOS capacitor into which electrons flow may depend on a direction of the electric field in the position occupied by the MOS capacitor E 231 in the detection region 221. Thus, an intensity and direction of an electric field may be measured from a change in amounts of electric charges in the MOS capacitors in the detection region 221.

For example, an electric field measurement device for measuring an electric field in 1D may include an input circuit 222 and an output circuit 223 to supply electric charges to MOS capacitors, similarly to the electric field measurement device with a single MOS capacitor described with reference to FIG. 2A. The input circuit 222 of the electric field measurement device for measuring an electric field in 1D may include an input diode 224 and an input gate 225, similarly to the input circuit 202 of the electric field measurement device using a single MOS capacitor. Also, the output circuit 223 of the electric field measurement device for measuring an electric field in 1D may include an output diode 228 and an output gate 227, similarly to the output circuit 203 of the electric field measurement device using a single MOS capacitor. A configuration and operation principle of each of an input circuit and output circuit will be further described with reference to FIGS. 5 and 6 below.

FIG. 2C is a diagram illustrating a basic structure of a measurer in an electric field measurement device for measuring an intensity and direction of an electric field in 2D according to an example embodiment. Referring to FIG. 2C, a measurer 240 of the electric field measurement device for measuring an intensity and direction of an electric field in 2D may include a plurality of MOS capacitors located in 2D, similarly to the measurer 220 that measures an intensity and direction of an electric field in 1D, and may change a distribution of electric potential energy on a substrate through gate voltages applied to the MOS capacitors, which may be used to store electrons in the MOS capacitors and to enable an inflow and/or outflow of electrons due to an electric field radiated from the outside.

Also, the electric field measurement device for measuring an electric field in 2D may include an input circuit 241 and an output circuit 246 to input electric charges to MOS capacitors in a detection region 245 and to output electric charges. The input circuit 221 of the measurer 240 that measures an electric field in 2D may include an input diode 242 and an input gate 243, similarly to the input circuit 222 of the measurer 220 that measures an electric field in 1D, and may include an input register 244 configured to temporarily store initialization information that is to be input to a plurality of MOS capacitors included in the detection region 245. Here, the input register 244 may include a plurality of MOS capacitors, may store continuously input initialization information in a form of an amount of electric charges, and may transmit the initialization information to the detection region 245.

The output circuit 246 of the measurer 240 that measures an electric field in 2D may include an output diode 247, an output gate 248 and an amplification circuit 249, similarly to the output circuit 223 of the measurer 220 that measures an electric field in 1D, and may include an output register 250 configured to temporarily store a measurement result that is to be output from the plurality of MOS capacitors in the detection region 245. Here, the output register 250 may include a plurality of MOS capacitors, and may store a continuously output measurement result in a form of an amount of electric charges, and the stored electric charges may be output through the output diode 247 and the amplification circuit 249 to the outside.

FIGS. 3A through 3F are diagrams illustrating an electric field measurement principle of an electric field measurement device using a MOS capacitor according to an example embodiment.

Figure 3A:
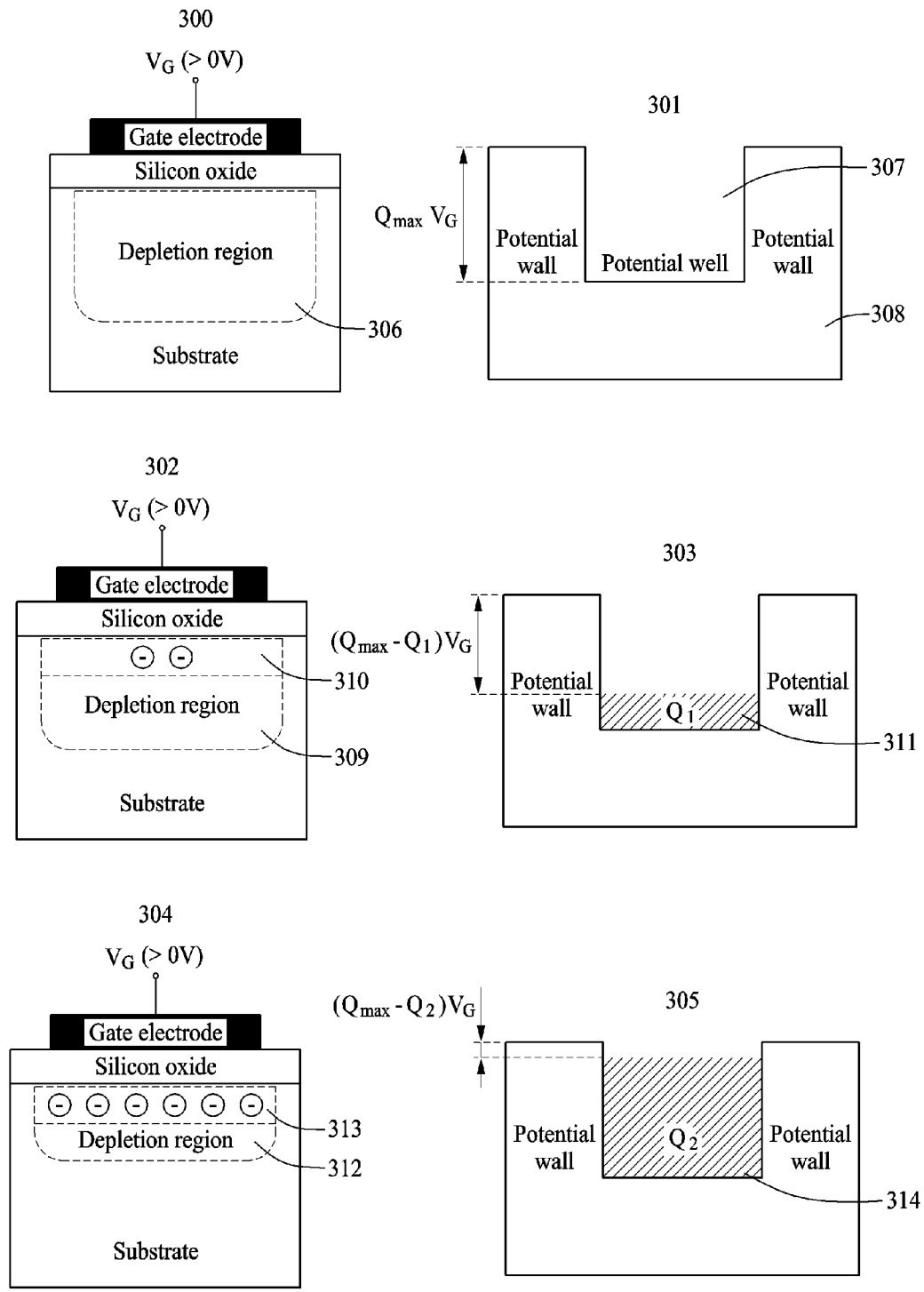

FIG. 3A is a diagram illustrating an operation principle of at least one MOS capacitor included in an electric field measurement device using a MOS capacitor according to an example embodiment.

As shown in a part 300, when a positive voltage (+) is applied to a gate electrode of a MOS capacitor, a hole on a substrate may move to an opposite side to the gate electrode. Also, since a free electron does not exist in an ideal P-type semiconductor, an electron pulled by a positive voltage (+) may not exist. Accordingly, a depletion region 306 in which a hole and electron are absent may be formed in a substrate region adjacent to a gate electrode.

A gate voltage applied to the MOS capacitor as shown in the part 300 may change a distribution of electric potential energy on the substrate as shown in a part 301. Here, potential energy may refer to a relative position to a force to pull an arbitrary object, and may decrease as the force increases. An electric force by a gate voltage may be used to pull an electron in the MOS capacitor, and may increase as the gate voltage increases. Accordingly, as the gate voltage increases, electric potential energy may decrease. However, in view of potential energy in another substrate region, a substrate region in which electric potential energy is reduced by a gate voltage of a MOS capacitor may have a shape of a puddle. A region with relatively low potential energy in comparison to other regions may be referred to as a "potential well 307."

Generally, an object or material in a high energy state has a property of moving to a low energy state. Similarly, an electron in a high energy state outside a potential well may try to move into the potential well in a low energy state, whereas an electron in a low energy state within a potential well may not move out from the potential well unless the electron acquires extra energy to be in an energy state outside the potential well.

The potential well 307 may be enclosed by a region with high potential energy which is conceptually referred to as "potential wall 308." Here, a height of the potential wall 308 may be equal to a depth of the potential well 307, which may be the same as a difference between potential energy of the potential well and potential energy outside the potential well. Accordingly, an amount of energy required for an electron in a potential well in a low energy state to move out from the potential well may be equal to a height of the potential wall.

A maximum amount of electric charges capable of being stored in the MOS capacitor through a positive gate voltage (+) $V_G$ as shown in the part 300 may be represented by "$Q_{max}=C_{ox}V_G$ ($C_{ox}$: a capacitance of the MOS capacitor)," and energy of the stored electric charges may be represented by "$E_{max}=Q_{max}V_G$." Accordingly, a depth of a potential well may be "$W_{well}=Q_{max}V_G$." Also, since the MOS capacitor does not include a free electron in the part 300, the potential well of the part 301 may be empty. Here, a height of the potential wall may be equal to a depth of the potential well, which may represented by "$h_{wall}=Q_{max}V_G$." In the above state, when a free electron is present in a substrate region, the free electron may be easily stored in the empty potential well 307 formed by the gate voltage.

When free electrons flow into a depletion region 309 as shown in a part 302, the free electrons may be pulled to a surface of the substrate by the positive gate voltage (+). Here, a substrate region below the gate electrode may have negative charges due to the electrons, unlike another substrate region that has positive charges due to holes. The substrate region with the negative charges may be referred to as an "inversion layer 310." Because a gate voltage is offset by the negative charges collected on a formed inversion layer, a depth of the depletion region 309 may be less than a depth of a depletion region 306 of the part 300 formed before the inversion layer is formed.

A part 303 illustrates an electric potential energy distribution of a MOS capacitor that includes the inversion layer 310 formed in the depletion region 309 as shown in the part 302. When an amount 311 of electric charges to form the inversion layer 310 of the part 302 is denoted by $Q_1$, a height of a potential wall may be "$h_{wall}=(Q_{max}-Q_1)V_G$" that is reduced by energy $Q_1V_G$ due to an amount of electric charges of the inversion layer. Accordingly, when electrons 311 stored in the potential well acquire energy greater than $h_{wall}$, the electrons may flow out from the potential well by passing the potential wall. For example, when an electric field with a magnitude of E is applied to the MOS capacitor of the part 302, kinetic energy of the electrons stored in the MOS capacitor may be increased by an operation of electric force due to the electric field. Here, when an amount of kinetic energy to be increased becomes greater than or equal to a height, that is, $(Q_{max}-Q_1)V_G$ of the potential wall, a portion of the electrons stored in the MOS capacitor may flow out from the potential well.

A part 304 illustrates a change in a depletion region 312 and an inversion layer 313 based on an inflow of a larger amount of free electrons in the inversion layer 310 formed as shown in the part 302. In the part 304, the inversion layer 313 formed in the depletion region 312 includes a large number of electrons in comparison to the inversion layer 310 of the part 302, and accordingly may have higher negative charges. Since a higher gate voltage is offset by the higher negative charges, a depth of the depletion region 312 may become less than a depth of the depletion region 309 of the part 302. Also, the above state may be represented as a state in which a plurality of electric charges $Q_2$ 314 flow into a potential well as shown in a part 305. When an amount $Q_2$ of electric charges in the MOS capacitor becomes close to the maximum amount $Q_{max}$ of electric charges, the height of the potential wall may be significantly reduced, and a force to bind electric charges stored in the MOS capacitor may be extremely weak. Accordingly, electric charges stored in a potential well with a low depth may be easily released by a weak force.

As described above, characteristics, for example, a change in a sensitivity to an inflow and/or outflow of electrons based on an amount of electric charges in a MOS capacitor, a formation of an inversion layer by introduced electrons and a formation of a depletion region by a gate voltage applied to a MOS capacitor will be described based on a physical concept such as a potential well. An electric field measurement device according to an example embodiment may properly dispose a potential well on a surface of a substrate based on the above characteristics and may adjust an amount of electric charges stored in the potential well, to measure an intensity and direction of an electric field radiated to the electric field measurement device. Here, an arrangement of a plurality of MOS capacitors for a formation of a potential well with an arbitrary shape may be determined based on a physical shape of a gate electrode, a magnitude of a gate voltage applied to each of the plurality of MOS capacitors, and a difference in a gate voltage control method for an electric charge transfer operation that will be described with reference to FIG. 4A. Accordingly, a potential well arrangement and measurement method for measurement of an intensity and direction of an electric field will be described with reference to FIGS. 3B through 3F, and then a method of arranging MOS capacitors for an arrangement of potential wells in a substrate will be described with reference to FIGS. 4A and 4B.

FIG. 3B is a diagram illustrating an arrangement of potential wells for measurement of an intensity and direction of an electric field in 1D. A measurer of an electric field measurement device according to an example embodiment may measure an intensity and direction of an electric field in 1D based on potential wells that are arranged in a line and electric charges injected into the potential wells. For example, the measurer of the electric field measurement device may include three potential wells as shown in a part 320. When each of the potential wells is assumed to be formed by a gate voltage $V_0$, a depth of each of the potential wells may be the same as $Q_{max}V_0$. When an amount $Q_0$ of initialization electric charges is assumed to be input to a potential well 2 322 located in a central portion of the measurer through an input circuit, a height of a potential wall in the potential well 2 322 may be "$(Q_{max}-Q_0)V_0$." As described above with reference to FIG. 3A, a height of a potential wall may be used to determine a sensitivity to an outflow of electric charges, and accordingly a value of each of $V_0$ and $Q_0$ may be set based on a sensitivity to the electric field.

A potential well 1 321 and a potential well 3 323 may be disposed at symmetrical positions with respect to the potential well 2 322. Here, when an electric field applied in a direction −x supplies energy greater than or equal to "$(Q_{max}-Q_0)V_0$" as shown in a part 324, electrons stored in the potential well 2 322 may be released from the potential well 2 322 and move in a direction +x that is opposite to the direction of the electric field, a portion or all of the electrons may be stored in the potential well 3 323 with low electric potential energy. Here, when an amount of released electric charges is denoted by $\Delta Q$, an amount of electric charges in the potential well 2 322 after an exposure to the electric field may be "$(Q_0-\Delta Q)$." Also, when all the released electric charges are assumed to flow into the potential well 3 323, an amount of electric charges in the potential well 3 323 may be $\Delta Q$. Since a value of $\Delta Q$ is proportional to an amount of energy transferred by the electric field, an intensity of the electric field may be calculated from $\Delta Q$. Also, since a movement direction of the released electric charges is opposite to the direction of the electric field, the direction of the electric field may be the direction −x that is opposite to a direction from the potential well 2 322 to the potential well 3 323.

When the electric field measurement device is exposed to an extremely strong electric field, electrons flowing from the potential well 2 322 into the potential well 1 321 or the potential well 3 323 may be released again from the potential well 1 321 or the potential well 3 323. Accordingly, it may be difficult to accurately measure the intensity and direction of the electric field. Referring to a part 325 of FIG. 3C, to prevent electros flowing into a potential well from being released again from the potential well, a measurer may be configured by arranging one or more empty potential wells 328 on both left and right sides in addition to the potential wells of the part 320 so that electrons flowing into empty potential wells 327 around a central potential well 326 may be released from the potential wells 327 and flow into the potential wells 328.

More fundamentally, a phenomenon in which electrons flowing into an empty potential well are released from the empty potential well again may occur because a force to bind the electrons in the empty potential well is not strong enough to bind the electrons. Accordingly, electrons may be bound more strongly by setting empty potential wells 331 to have a greater depth as shown in a part 329. In this example, a height of a potential wall to prevent a movement of electrons may be guaranteed even though all electric charges stored in a central potential well 330 move to the empty potential wells 331. Thus, potential wells with different depths may be easily formed by adjusting a gate voltage applied to each of MOS capacitors as described above with reference to FIG. 3A.

Figure 3D:
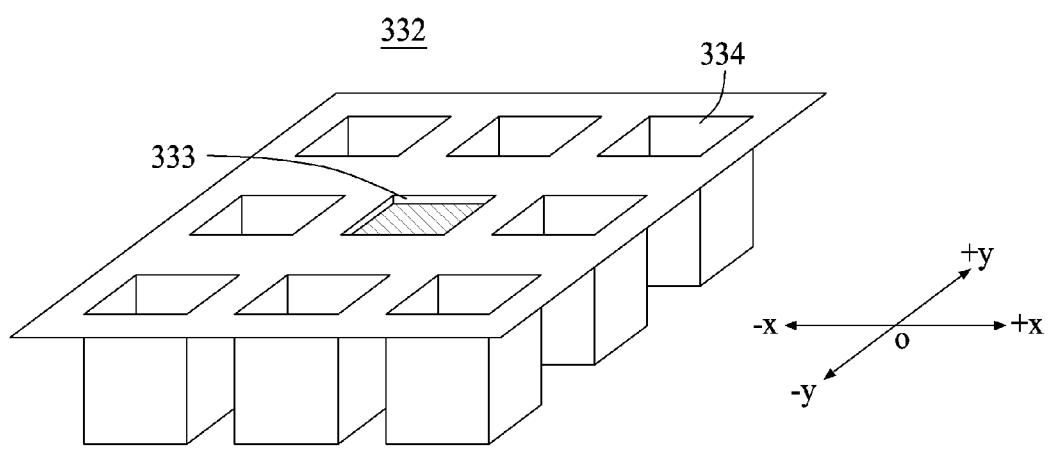

FIG. 3D illustrates an arrangement of potential wells to measure an intensity and direction of an electric field in 2D. An electric field measurement device for measuring an intensity and direction of an electric field in 2D according to an example embodiment may be designed by a method of FIG. 3B for arranging potential wells in parallel to measure an intensity and direction of an electric field in 1D.

Referring to a part 332, in a measurer of the electric field measurement device, nine potential wells are arranged by implementing, in three rows, the arrangement of the potential wells of the part 320. Initial electric charges may be input to a central potential well 333 to have an appropriate amount of electric charges based on a sensitivity to an electric field in the same manner as the method of FIG. 3B for arranging potential wells to measure an intensity and direction of an electric field in 1D. Also, potential wells 334 that surround the central potential well 333 may be set to be empty so that electrons may be released from the central potential well 333 and flow into the potential wells 334, in the same manner as the method of arranging potential wells to measure an intensity and direction of an electric field in 1D.

The electric field measurement device may measure an intensity and direction of an electric field in 2D based on relative positions of the potential wells 334 with respect to the central potential well 333 and a change in an amount of electric charges in each potential well after an exposure to the electric field. In the electric field measurement device for measuring an intensity and direction of an electric field in 2D, the relative positions of the potential wells 334 with respect to the central potential well 333 may be represented as direction vectors in an orthogonal coordinate system, and an amount of electric charges flowing into the potential wells 334 may be represented by a magnitude of a vector. Accordingly, an intensity of an electric field for a direction of each potential well may be represented by a vector in the orthogonal coordinate system. When the above vectors are combined, a single vector indicating the intensity and direction of the electric field may be obtained. A method of measuring an intensity and direction of an electric field in 2D will be further described with reference to FIG. 3E below.

FIG. 3E illustrates a method of measuring an intensity and direction of an electric field based on an arrangement of potential wells in a measurer to measure the intensity and direction of the electric field in 2D.

A part 340 illustrates an arrangement of potential wells in the above-described measurer of the part 332 to measure an intensity and direction of an electric field in 2D. Positions of potential wells of the part 340 may be represented by coordinates in the orthogonal coordinate system as shown in a part 341.

A part 342 illustrates an amount of electric charges stored in each of the potential wells before an exposure to an electric field. Before the exposure to the electric field, an appropriate amount of electric charges based on a sensitivity due to the exposure to the electric field may be injected into a potential well E located in a central portion of the measurer. For example, in the part 342, negative charges of 10 fC may be injected into the potential well E. Also, potential wells other than the potential well E may be set as empty potential wells. In this example, when an electric field is radiated from the outside, a portion of electric charges stored in the potential well E may be released and flow into another potential well, and accordingly a distribution of amounts of electric charges stored in the potential wells of the measurer may change. For example, in a part 343, a portion of electric charges stored in the potential well E may be released, and accordingly an amount of electric charges in the potential well E may be reduced. In this example, the electric charges released from the potential well E may flow into potential wells B, C and F, and accordingly a distribution in amounts of electric charges may change so that the amounts of electric charges in the potential wells B, C and F may increase.

A magnitude of an electric field for each of directions of potential wells from a central potential well may be calculated by using relative positions of the potential wells and a change in a distribution of amounts of electric charges in a measurer, which may be represented by a vector in the orthogonal coordinate system as shown in a part 344. When electric field component vectors are $\vec{E}_B$, $\vec{E}_C$ and $\vec{E}_F$, $\vec{E}_{TOT}$ obtained by adding up electric field component vectors may be a vector representing a direction and intensity of an electric field radiated to the measurer. Using the above-described method, the electric field measurement device may measure a direction and intensity of an electric field in 2D.

FIG. 3F illustrates an operating method of a measurer of an electric field measurement device for visualizing an electric field distributed in 2D.

The measurers for measuring an electric field in 1D or 2D as described above with reference to FIGS. 3B through 3E may be used as measuring units to implement a measurer of the electric field measurement device for visualizing an electric field distributed in 2D. When a plurality of electric field measuring units are arranged in space, information about a direction and intensity of an electric field 의 intensity may be acquired from a position of each of the electric field measuring units and may be combined to visualize a distribution of the electric field in a 2D space.

Referring to FIG. 3F, a measurer 345 of the electric field measurement device may use, as a measuring unit, the measurer of FIGS. 3D and 3E in the electric field measurement device for measuring a direction and intensity of an electric field in 2D. Here, measuring units 346 of the measurer 345 may measure a direction and intensity of an electric field in their respective positions. For example, when the measurer 345 is exposed to an electrostatic field due to positive charges 347, the measuring units 346 in the measurer 345 may measure an intensity and direction of the electric field in the respective positions. When measurement results of the measuring units 346 are combined, a distribution of an electric field in 2D may be visualized as shown in a part 348.

Figure 4A:
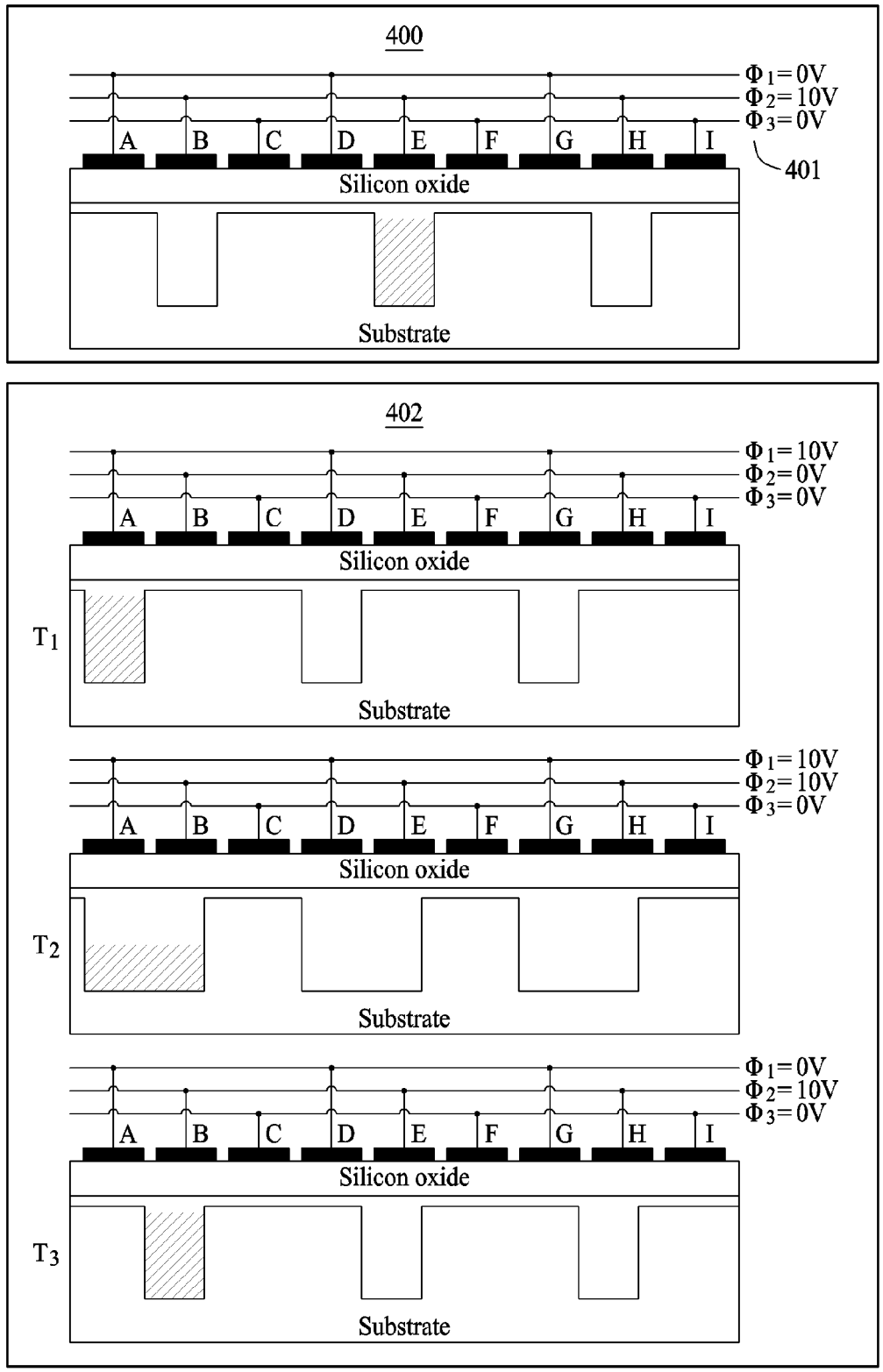

FIGS. 4A and 4B are diagrams illustrating a method of implementing a measurer of an electric field measurement device using MOS capacitors according to an example embodiment.

A method of implementing an arrangement of potential wells for measurement of an intensity and direction of an electric field using MOS capacitors and an electric charge transfer operation between MOS capacitors in a measurer are described with reference to FIGS. 4A and 4B.

The arrangement of the potential wells to measure an electric field in 1D or 2D as described above with reference to FIGS. 3B through 3F may be implemented by a plurality of MOS capacitors arranged in a 1D or 2D space. Since a gate voltage applied to a MOS capacitor changes electric potential energy of a surface of a substrate, the arrangement of the potential wells of FIGS. 3B through 3F may be implemented by applying different gate voltages to MOS capacitors that are properly arranged. Here, as described above FIGS. 2A and 2B, an input circuit and an output circuit of a measurer configured by arranging MOS capacitors may be located in a first portion and a last portion of the measurer, and accordingly it may be impossible to input electric charges directly to an arbitrary MOS capacitor or to output electric charges directly from the arbitrary MOS capacitor. Thus, an electric charge transfer operation of sequentially moving electric charges between neighboring MOS capacitors may need to be performed to input or output electric charges to or from an arbitrary potential well formed in the measurer.

As described above, a measurer of an electric field measurement device according to an example embodiment may need to implement an arrangement of potential wells using different gate voltages applied to a plurality of MOS capacitors, and also need to perform an electric charge transfer operation between neighboring MOS capacitors. The measurer of the electric field measurement device may be implemented as a charge-coupled device (CCD).

Referring to FIG. 4A, the electric field measurement device based on an arrangement of potential wells in the part 320 of FIG. 3B may be implemented using a 3-phase linear CCD. The 3-phase linear CCD may include three phase lines and MOS capacitors arranged in 1D, and each of the phase lines may be connected to a plurality of MOS capacitors. Here, a gate voltage for an electric charge transfer operation between MOS capacitors and the arrangement of potential wells for an electric field measurement may be applied through each of the phase lines.

Referring to a part 400, a measurer according to an example embodiment may be designed as a 3-phase CCD including nine MOS capacitors. The MOS capacitors may be sequentially connected to a phase line 1 Φ1, a phase line 2 Φ2 and a phase line 3 Φ3, and accordingly gate voltages may be applied to the MOS capacitors through the above phase lines 401. In the part 400, the phase line Φ1 may be connected to a MOS capacitor A, a MOS capacitor D and a MOS capacitor G, and the phase line Φ2 may be connected to a MOS capacitor B, a MOS capacitor E and a MOS capacitor H. Also, the phase line Φ3 may be connected to a MOS capacitor C, a MOS capacitor F and a MOS capacitor I. The MOS capacitors in the measurer may be connected to the set phase lines 401, and accordingly a gate voltage may be applied to each of the MOS capacitors through the phase lines 401. For example, when a voltage is applied to the phase line Φ1, gate voltages may be applied to the MOS capacitor A, the MOS capacitor D and the MOS capacitor G.

The measurer may form a potential well for an electric field measurement using a voltage applied to the phase lines 401. For example, when a voltage of 10 V is applied to the phase line Φ2 and when the phase lines Φ1 and Φ3 are set to 0 V as shown in the part 400, a potential well with the same shape as that of the part 320 may be formed on a substrate.

A part 402 illustrates a method of performing an electric charge transfer operation in the measurer over time. At a time $T_1$, a voltage of 10 V is applied to the phase line $\Phi 1$. Accordingly, a potential well is formed in the MOS capacitor A. Here, it is assumed that the MOS capacitor A stores an arbitrary amount of electric charges. When a voltage of 10 V is applied to the phase lines $\Phi 1$ and $\Phi 2$ at a time $T_2$, a potential well may be extended over the MOS capacitor A and the MOS capacitor B and a portion of electric charges stored in the MOS capacitor A may move to the MOS capacitor B. When a voltage of the phase line $\Phi 1$ is set to 0 V at a time $T_3$, all the electric charges stored in the MOS capacitor A at the time $T_2$ may move to the MOS capacitor B. Using the same method, electric charges stored in the MOS capacitor B may be moved to the MOS capacitor C by controlling voltages of the phase lines $\Phi 2$ and $\Phi 3$, and electric charges stored in the MOS capacitor C may be moved to the MOS capacitor D by controlling voltages of the phase lines $\Phi 1$ and $\Phi 3$. For the other MOS capacitors, the electric charge transfer operation may be performed using the same method.

As described above with reference to FIG. 3D, a structure of a measurer to measure an intensity and direction of an electric field in 2D may be formed based on a structure of a measurer to measure an intensity and direction of an electric field in 1D. Referring to FIG. 4B, a measurer of a part 403 to measure an intensity and direction of an electric field in 2D may be designed by implementing, in three rows, an arrangement of the MOS capacitors of the measurer of FIG. 4A to measure an intensity and direction of an electric field in 1D as shown in a part 404. Here, all potential wells in a first row and a third row may be set as empty potential wells, and accordingly electrons released from a central MOS capacitor of a second row may flow into empty potential wells.

Here, when a measurer is implemented using MOS capacitors with the same size as shown in the part 403, a gap between the empty potential wells into which electrons released from the central MOS capacitor in the measurer need to be introduced may be greater than a size of a potential well. Accordingly, electrons released from a central portion of the measurer may be highly likely to move based on a flat energy distribution above a potential wall, instead of flowing into the empty potential wells, and as a result, an error in measurement of a direction of an electric field may remarkably increase.

The above error may be reduced by configuring a measurer using MOS capacitors that have physically different shapes. Referring to a part 405, MOS capacitors of a measurer may be divided into MOS capacitors 406 in which a potential well is formed for an electric field measurement, and MOS capacitors 407 used to perform an electric charge transfer operation and to form a potential wall. Since the above-described error occurs due to a great gap between potential wells in comparison to a size of a potential well, a MOS capacitor 406 that is greater in size than a MOS capacitor 407 used for the electric charge transfer operation may be used to form a potential well, to increase a probability that electric charges released due to an electric field flow into the potential well.

Figure 5:
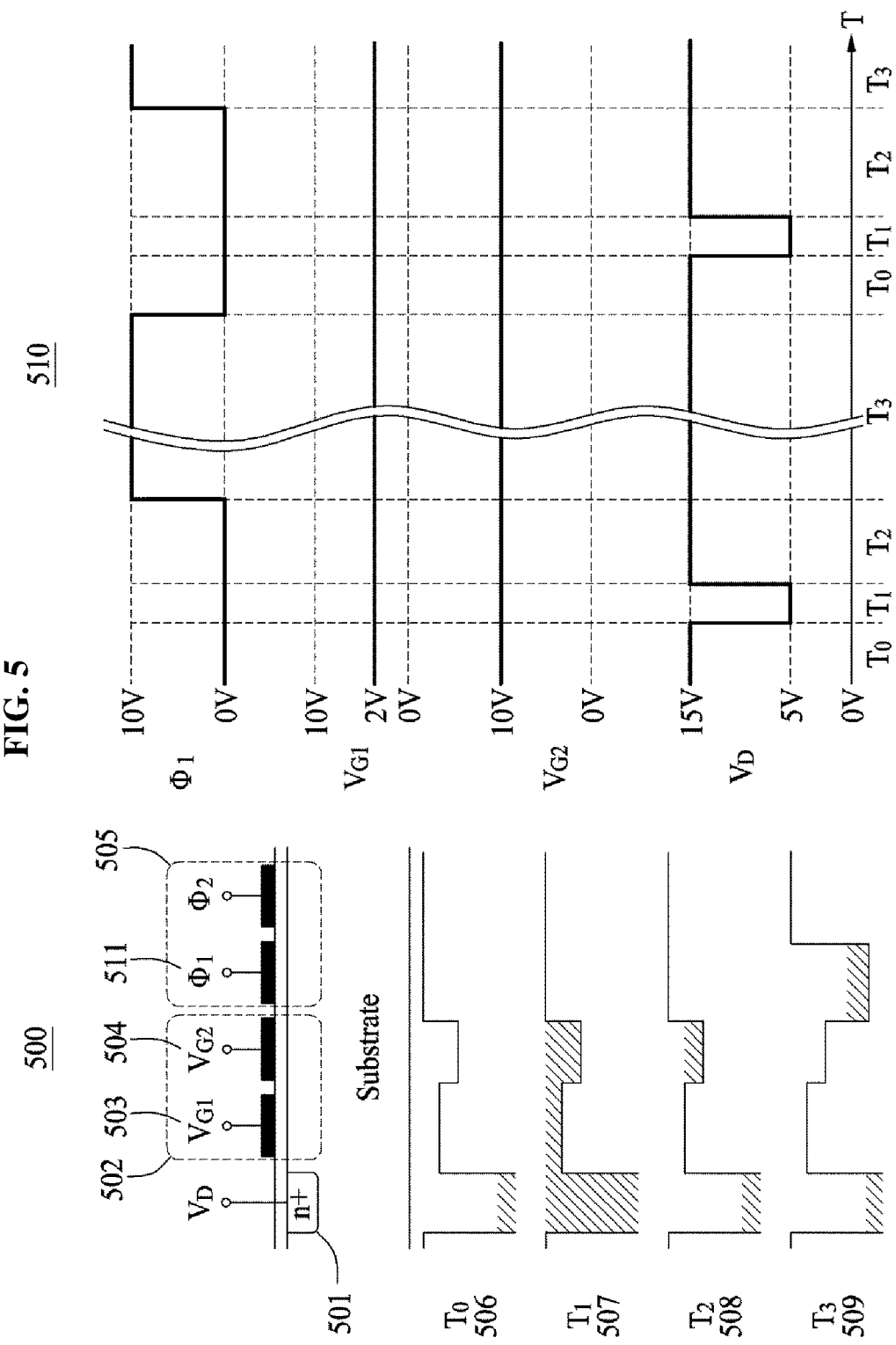
FIG. 5 is a diagram illustrating an input circuit of an electric field measurement device using a MOS capacitor according to an example embodiment.

FIG. 5 is a diagram illustrating an input circuit of an electric field measurement device using a MOS capacitor according to an example embodiment.

Referring to FIG. 5, an input circuit 500 may store an input signal that is provided in a form of a voltage, as an amount of electric charges in a MOS capacitor of a detection region 505. The input circuit 500 may include an input diode 501 configured to supply electrons to the input circuit 500, and two input gates 502.

The input circuit 500 may operate similarly to a metal-oxide-semiconductor field effect transistor (MOSFET) that includes a source and drain. The input diode 501 may supply electrons to the input circuit 500, similarly to the source of the MOSFET. Input electrons may move to an input gate 2 504 that functions as a drain of the MOSFET along a channel formed in a region of a substrate corresponding to an input gate 1 503 based on a voltage $V_{G1}$ set as an appropriate magnitude, and may be stored in a region of a substrate corresponding to the input gate 2 504. Initialization information provided to a measurer of the electric field measurement device according to an example embodiment may be used as an input signal of the input circuit 500 included in the measurer. Here, the input signal may be applied to the input gate 2 504. Also, an amount of electric charges stored in the input gate 2 504 may depend on a difference between a voltage $V_{G2}$ that is a magnitude of the input signal and the voltage $V_{G1}$ that is applied to the input gate 1 503.

Parts 506 through 509 illustrate distributions of electric charges and electric potential energy in the input circuit over time during an amount of time from a time $T_0$ to a time $T_3$, and a part 510 is a graph illustrating voltages applied to the input diode 501, the input gate 1 503 and the input gate 2 504 included in the input circuit over time. An operation of the input circuit 500 based on a flow of time will be further described with reference to the parts 506 through 510. At the time $T_0$ of the part 506, a voltage $V_D$ is set to 15 V and the voltage $V_{G2}$ is set to 10 V. The voltage $V_{G1}$ is set to 2 V, and accordingly a channel between the input diode 501 and the input gate 2 504 may be formed. However, because the voltage $V_D$ of the input diode 501 is higher than the voltage $V_{G2}$, an electron may not be input yet. When the voltage $V_D$ is set to 5V at a time $T_1$ of the part 507, an electron supplied from the input diode 501 may move to the input gate 2 504 with low electric potential energy by passing through a channel of the input gate 1 503. The voltage $V_D$ may be set to 15 V again at a time $T_2$ of a part 508, and a portion of electrons stored in the input circuit 500 may flow out through the input diode 501 again. Here, electrons stored in the input gate 2 504 may be confined in a potential well formed by a potential difference between the voltages $V_{G1}$ and $V_{G2}$. At the time $T_3$ of the part 509, a voltage of 10 V may be applied to a phase 1 gate 511 of the detection region 505, and electrons stored in the input gate 2 504 may be moved to a MOS capacitor located at the front of the detection region 505.

The electric field measurement device using a MOS capacitor may measure an intensity of an electric field based on an amount of electric charges before and after an exposure to the electric field, and accordingly the input circuit 500 in the electric field measurement device may need to be designed to accurately control an amount of electrons to be input to the MOS capacitor. The amount of electrons to be input to the MOS capacitor may be determined by a difference between voltages applied to the input gate 1 503 and the input gate 2 504, and thus the input circuit 500 may accurately control an amount of electrons to be stored in the MOS capacitor.

Also, a configuration of the input circuit 500 may be variously changed. In an example, an input circuit 201 may include only a single input gate 502, and may replace the input gate 2 504 with a MOS capacitor of a detection region 201. In another example, an input circuit 201 may be modified to apply an input signal to the input diode 501 instead of to the input gate 502. It is obvious to one of ordinary skill in the art that the above input circuit may be easily modified based on the above description.

Figure 6:
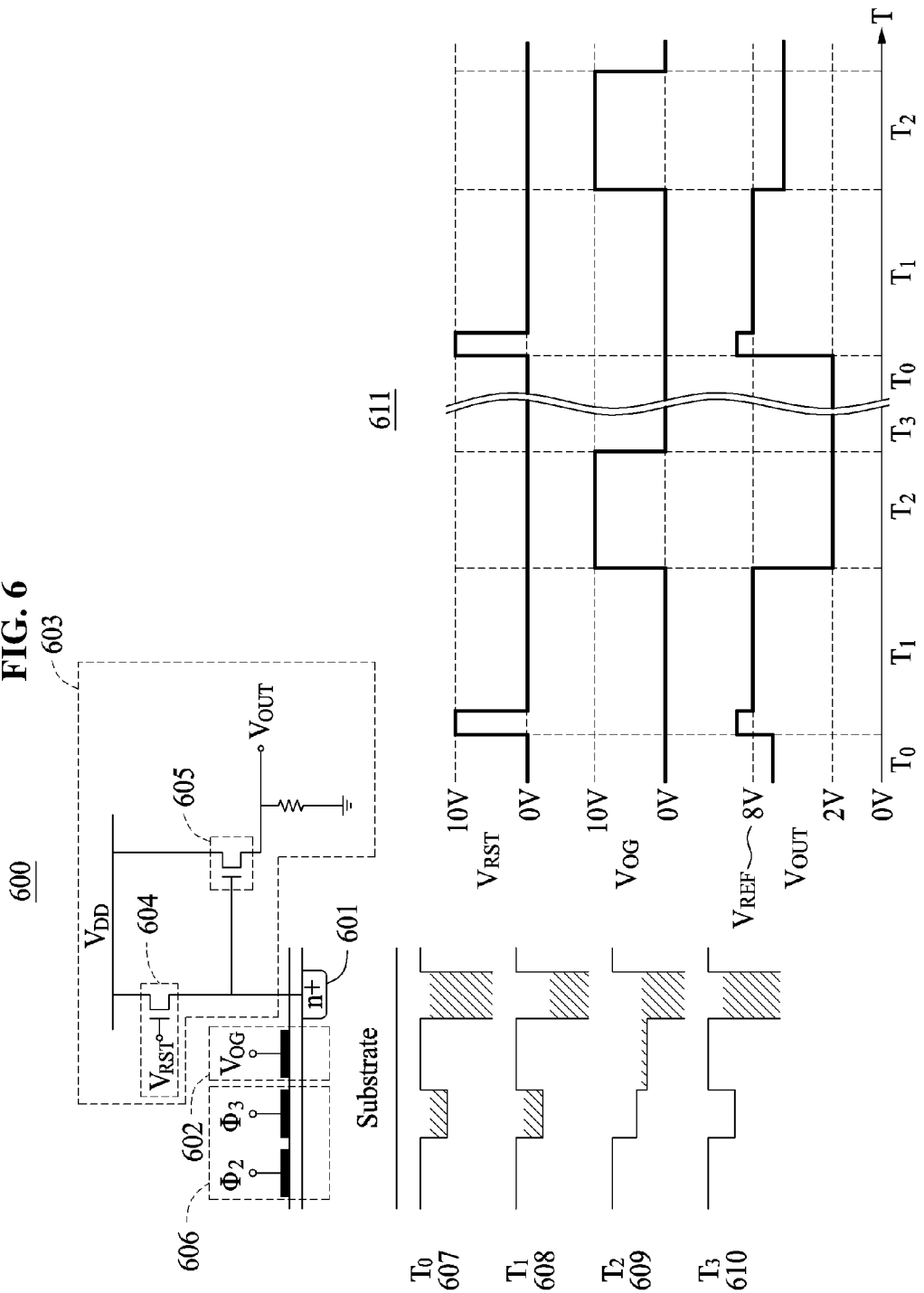
FIG. 6 is a diagram illustrating an output circuit of an electric field measurement device using a MOS capacitor according to an example embodiment.

FIG. 6 is a diagram illustrating an output circuit of a measurer included in an electric field measurement device using a MOS capacitor according to an example embodiment.

Referring to FIG. 6, an output circuit 600 may output an amount of electric charges stored in a detection region 606 in a form of a voltage. The output circuit 600 may include a single output diode 601, a single output gate 602, and an amplification circuit 603. The output diode 601 may convert an amount of electric charges stored in a MOS capacitor into a voltage. The output gate 602 may control a movement of an electron from the detection region 606 to the output diode 601. The amplification circuit 603 may amplify a magnitude of a voltage output through the output diode 601. The amplification circuit 603 may include a reset switch 604 configured to initialize an output voltage $V_{OUT}$ to a reference voltage $V_{REF}$, and a MOS amplifier 605 configured to amplify a voltage output from the output diode 601.

In an operation of the output circuit over time, at a time $T_0$ of a part 607, electric charges to be output from a last MOS capacitor in the detection region 606 may be transferred. A voltage $V_{OG}$ of the output gate 602 may be set to 0 V, and accordingly electric charges may not be transferred to the output diode 601.

At a time $T_1$ of a part 608, to initialize the output voltage $V_{OUT}$ to the reference voltage $V_{REF}$, a voltage of 10 V may be applied in a form of a pulse to the reset switch 604. For example, in an initialization process of the output voltage $V_{OUT}$, extra negative charges stored in the output diode 601 may flow out from the output circuit 600 based on an input of a pulse signal. Accordingly, a circuit between the reset switch 604 and the output diode 601 may be charged with positive electric charges so that a positive voltage may be applied to the MOS amplifier 605. A current may flow in the MOS amplifier 605 due to a potential difference between a voltage $V_{DD}$ and a ground voltage of both ends of the MOS amplifier 605. An output voltage of the output circuit may be determined based on a magnitude of the current, and the determined voltage may be referred to as a reference voltage. The reference voltage of the output circuit may vary depending on a configuration of the output circuit. In FIG. 6, the reference voltage is assumed as 8 V.

At a time $T_2$ of a part 609, the voltage $V_{OG}$ is set to 10 V, and accordingly electric charges stored in the detection region 606 may move to the output diode 601. A negative charge output through the output diode 601 may lower a voltage applied to the MOS amplifier 605, and accordingly the voltage $V_{OUT}$ lower than the reference voltage may be output. For example, referring to a part 611, when the reference voltage $V_{REF}$ of 8 V is output at the time $T_1$, the output circuit 600 may output a voltage of 2 V due to a voltage drop caused by negative charges output through the output diode 601 at the time $T_2$.

At a time $T_3$ of a part 610, the output gate 602 is closed and an output operation is terminated. Here, the output voltage of 2 V may be maintained until the output voltage is initialized to the reference voltage at the time $T_1$ of the part 608.

Also, a configuration of the output circuit 600 may be variously changed. In an example, the output circuit 600 may include a plurality of amplification circuits 603. In this example, an output voltage may be amplified by stages, to minimize noise that may occur during amplification. In another example, the output circuit 600 may include a MOS capacitor in which two gate electrodes are layered, instead of including the output diode 601, similarly to a floating gate transistor. In this example, the output circuit 600 may measure an amount of electric charges stored in the MOS capacitor by measuring, using a floating gate, a voltage drop formed by the inversion layer of the MOS capacitor described above with reference to FIG. 3A, instead of outputting electric charges stored in the MOS capacitor to the outside. It is obvious to one of ordinary skill in the art that the above modifications of output circuit 600 may be easily implemented based on the above description.

Figure 7:
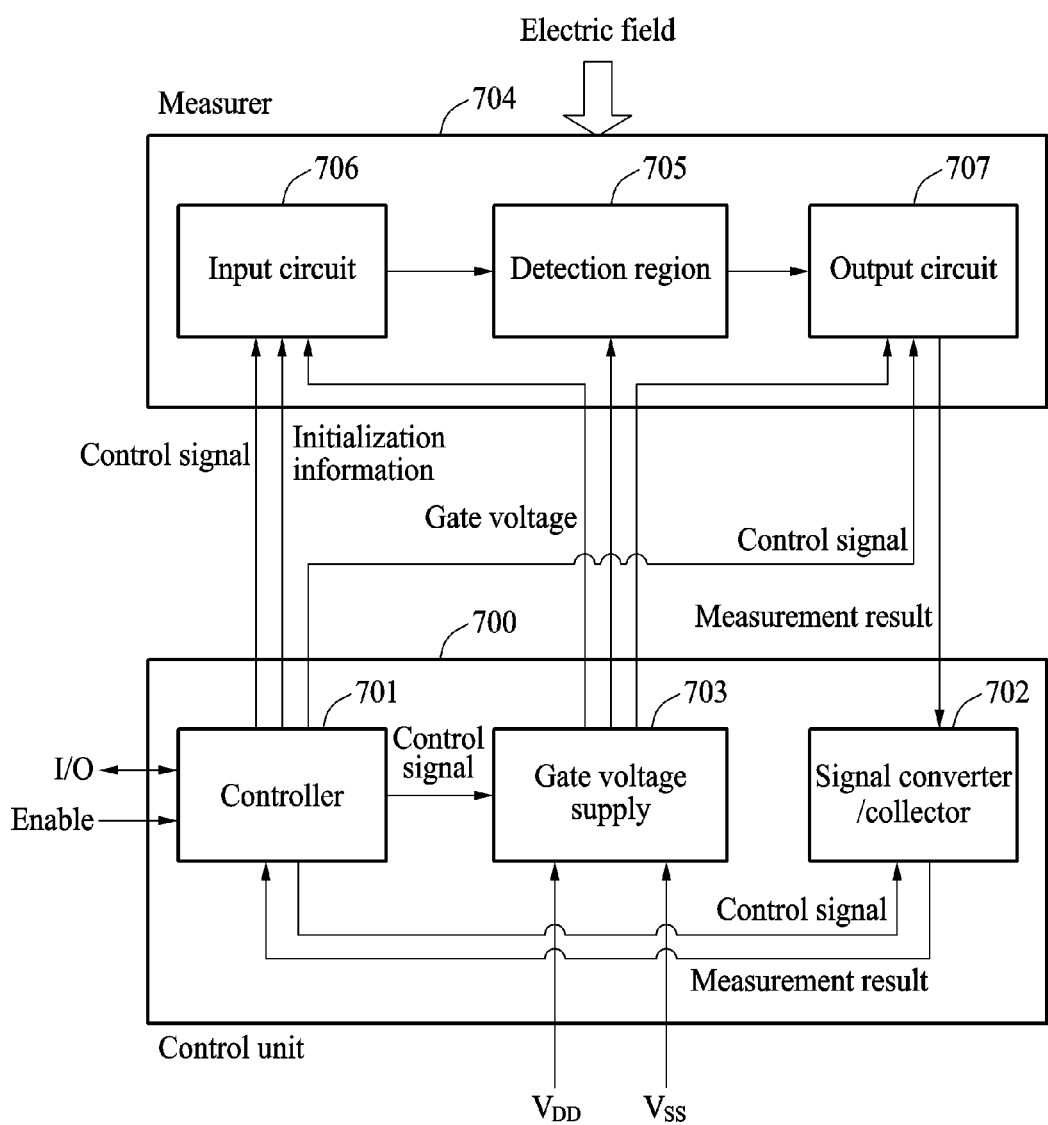
FIG. 7 is a diagram illustrating a configuration of a control unit included in an electric field measurement device according to an example embodiment.

FIG. 7 is a diagram illustrating a configuration of a control unit included in an electric field measurement device according to an example embodiment.

Referring to FIG. 7, a control unit 700 of an electric field measurement device according to an example embodiment may include a controller 701, a signal converter and/or collector (converter/collector) 702, and a gate voltage supply 703.

The controller 701 may control the measurer 704 to measure or not to measure an electric field based on an enable signal input from the outside. Also, the controller 701 may generate control signals to control components of the control unit 700 and the measurer 704, and initialization information that is to be input to the measurer 704, based on an I/O signal input from the outside. Here, the control signals provided by the controller 701 may include the gate voltage $V_{G1}$ applied to the input gate 1 503 of the input circuit 500 of FIG. 5, the gate voltage $V_{OG}$ applied to the output gate 602 of the output circuit 600 of FIG. 6, a control signal to control a collection and transmission of a measurement result of the signal converter/collector 702, and a control signal of the gate voltage supply 703 to determine a form of a gate voltage to be applied to a measurer based on an electric field measurement operation that will be described with reference to FIGS. 8A and 8B.

Also, the controller 701 may receive an input of initialization information that is to be input to the measurer 704 directly from the outside, or may receive an input of a sensitivity to an electric field to be measured from the outside and determine initialization information to be input to the measurer 704 based on the sensitivity.

The controller 701 may receive, using the signal converter/collector 702, a measurement result output from an output circuit 707 of the measurer 704 after an electric field measurement is completed. The received measurement result may be output to the outside using the I/O signal.

The controller 701 may control the gate voltage supply 703 so that information input for an electric field measurement may be stored in the measurer 704 and changed.

The signal converter/collector 702 may convert a measurement result output in a form of a voltage from the measurer 704 into a digital signal, and may transmit the digital signal to the controller 701 based on the control signal received from the controller 701.

The gate voltage supply 703 may be a device configured to generate output voltages with different magnitudes based on voltages $V_{DD}$ and $V_{SS}$ received from the outside, and may include, for example, a direct current (DC)-to-DC converter to generate an output voltage that is higher or lower than an input voltage using an electric condenser that is an energy storage device.

The gate voltage supply 703 may generate a gate voltage to control the measurer 704 based on the control signal received from the controller 701. The gate voltage generated by the gate voltage supply 703 may include a control clock for a transmission of electric charges, and a DC voltage provided for an electric field measurement. Here, a magnitude of the DC voltage provided to a detection region 705 for an electric field measurement as described above in FIG. 3A may need to be adjusted to an appropriate magnitude, to adjust a sensitivity to an inflow or outflow of electric charges when a MOS capacitor is exposed to an electric field. To this end, the gate voltage supply 703 may adjust a magnitude of a gate voltage that is to be provided to the detection region 705 of the measurer 704 based on the control signal received from the controller 701.

As described above with reference to FIG. 2C, the measurer 240 of the electric field measurement device for measuring an intensity and direction of an electric field in 2D may include the input register 244 to input information to a MOS capacitor and an output register 250 to output information stored in the MOS capacitor, and the input register 244 and the output register 250 may also require a control clock for a movement of stored electric charges, similarly to the detection region 705. Accordingly, the gate voltage supply 703 of an electric field measurement device for measuring an electric field in 2D may need to provide a gate voltage for a control clock transmission to an input circuit 706 and an output circuit 707 as well as the detection region 705. To this end, the gate voltage supply 703 may provide a control clock to each of the detection region 705, the input circuit 706 and the output circuit 707 based on the control signal received from the controller 701.

A structure of the control unit 700 in the electric field measurement device may be variously modified. In an example, the gate voltage supply 703 in the electric field measurement device may generate gate voltages with different magnitudes to control the measurer 704 from the voltages $V_{DD}$ and $V_{SS}$ and may provide the gate voltages to the controller 701, and the controller 701 may use the gate voltages to generate a control clock and a gate voltage that is to be provided to the measurer 704. In another example, the controller 701 in the electric field measurement device may be designed with a structure in which initialization information to be provided to the input circuit 706 is transmitted in a form of a digital signal to the signal converter/collector 702 and in which the signal converter/collector 702 transmits a voltage with an appropriate magnitude to be transmitted to the input circuit 706 as initialization information based on the received digital signal.

Figure 8A:
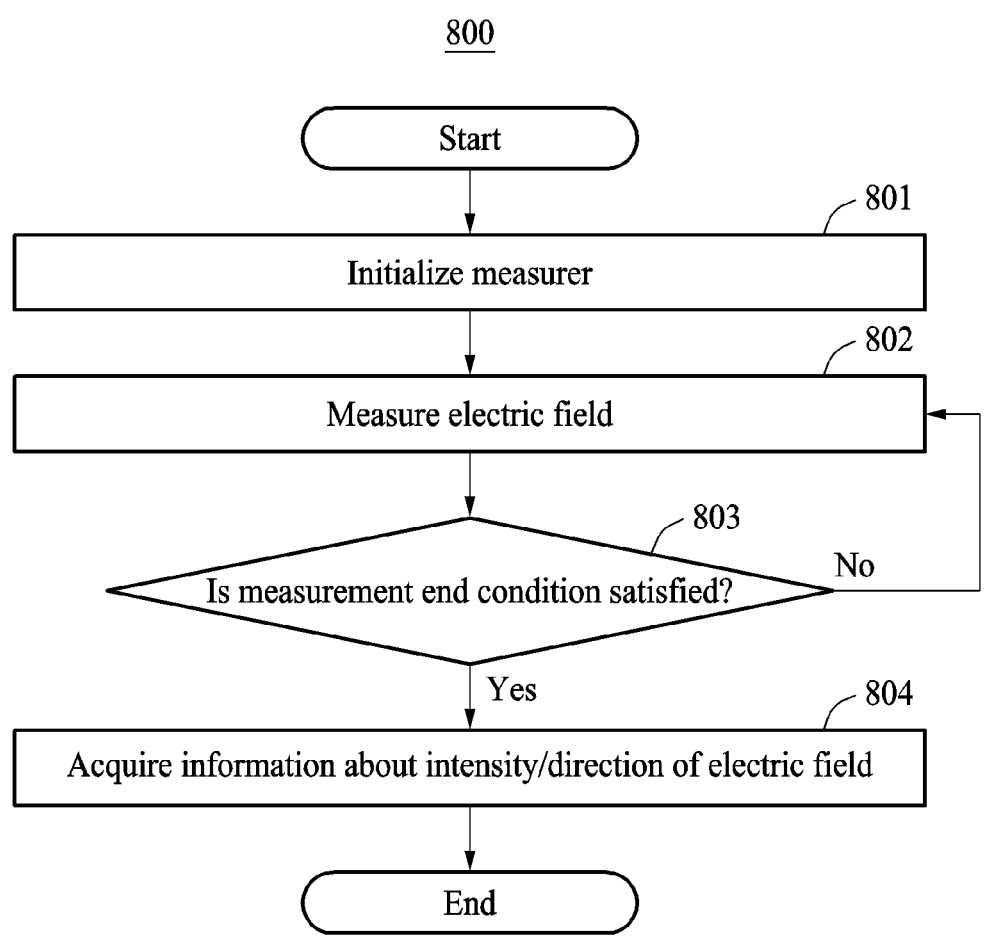

FIGS. 8A and 8B are flowcharts illustrating an electric field measurement method using a MOS capacitor according to an example embodiment.

Referring to FIG. 8A, the electric field measurement method may include an initialization operation, an electric field detection operation, and an operation of acquiring information about an intensity and/or direction of an electric field.

In the initialization operation, that is, operation 801, a measurer of an electric field measurement device is initialized in response to an initialization signal being received. For example, in operation 801, initialization information to be provided to the measurer may be determined based on a sensitivity to an outflow of electrons from the MOS capacitor included in the measurer or to an inflow of the electrons flowing out from the MOS capacitor when the measurer is exposed to an electric field. A set amount of electric charges may be input to the MOS capacitor of the electric field measurement device based on the determined initialization information, and the input electric charges may be transferred to a MOS capacitor at an appropriate position that is determined in advance for an electric field measurement. Also, in operation 801, a gate voltage applied to the measurer may be adjusted so that a potential well for an electric field measurement may be formed in the measurer, and an output voltage output from the measurer may be initialized to a reference voltage.

Operation 801 may include an operation of setting an amount of time during which the measurer is to be exposed to the electric field. In an example, in operation 801, an exposure time may be received as an input from a user. In another example, an exposure time may be set in advance when the electric field measurement device is designed.

In the electric field detection operation, that is, operation 802, the measurer is exposed to the electric field. In operation 802, a gate voltage of the measurer may be controlled so that the initialization information input in operation 801 may be changed by the electric field.

In operation 803, whether a measurement end condition is satisfied is determined. In operation 803, whether the exposure time set in advance in operation 801 has elapsed may be determined. Also, when it is determined that the exposure time has elapsed in operation 803, the gate voltage of the measurer may be controlled to prevent information stored in the measurer from being additionally changed by the electric field.

For example, the electric field measurement device may include a separate machine to electrically shield the measurer, instead of controlling the gate voltage of the measurer to prevent a change in the information stored in the measurer. In this example, when it is determined that the exposure time has elapsed in operation 803, the separate machine may be controlled to prevent the information stored in the measurer from being changed by the electric field.

When an electric field detection task is determined to be completed in operation 803, information about an intensity of the electric field and information about a direction of the electric field may be acquired based on a measurement result stored in the measurer in operation 804. For example, a measurement result output from the measurer may be represented by a magnitude of an output voltage of the output circuit described above with reference to FIG. 6, and may be converted into a digital signal by a signal converter/collector in a control unit. Also, the digital signal may be input to a pre-designed program, and the like, and may be used to calculate an intensity and direction of an electric field.

The electric field measurement device may provide a technology of measuring a change in an electric field over time by repeatedly performing the electric field measurement method of FIG. 8A. Referring to FIG. 8B, an electric field measurement device for measuring a change in an electric field over time may perform operation 811 of setting an exposure time and/or a number of exposures, operation 812 of initializing a measurer, operation 813 of measuring an electric field, operation 814 of determining whether the exposure time is exceeded, operation 815 of acquiring information about an intensity and/or direction of an electric field, and operation 816 of determining whether the number of exposures is exceeded.

In operation 811, an amount of time during which the electric field measurement device is exposed once, and a number of times that the electric field measurement device is repeatedly exposed, are set. Accordingly, a whole time to measure a change in an electric field over time may be set.

When an electric field is measured through operations 812, 813, 814 and 815, a measurement result may be transmitted directly to a control unit, or may be temporarily stored in a temporary storage and then transmitted to the control unit at a predetermined point in time. For example, a measurer may be designed to store measurement results in a plurality of temporary storages of the measurer and to transmit the measurement results all at once to the control unit when the temporary storages are full.

In operation 816, whether to exceed a predetermined number of exposures is determined after a single measurement is completed. When it is determined that the number of exposures is not exceeded, operation 812 may be reperformed to measure the electric field again. When it is determined that the number of exposures is exceeded after repeated electric field measurements are completed, an electric field measurement may be terminated.

FIGS. 9A through 9E are diagrams illustrating a type of an output voltage and a change in an amount of electric charges in a measurer for each of operations included in an electric field measurement method using a MOS capacitor according to an example embodiment.

Operation 801 of FIG. 8A may include operation 900 of inputting electric charges to a measurer and initializing an output voltage, and operation 910 of forming a potential well. Hereinafter, operations 900 and 910 will be further described with reference to FIGS. 9A and 9B, respectively.

Figure 9A:
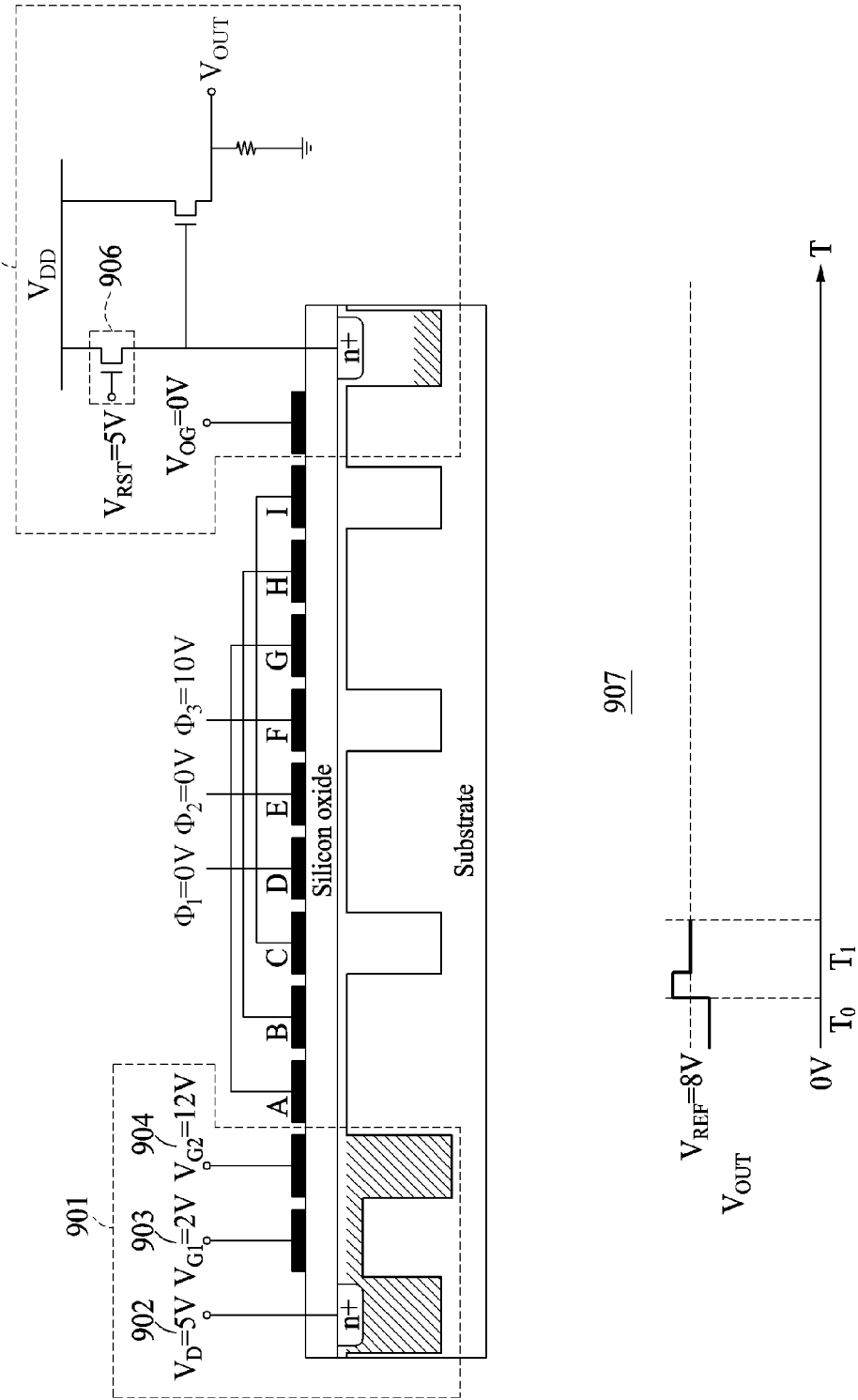

Referring to FIG. 9A, operation 900 is performed at a time $T_1$. In operation 900, an input circuit 901 of the measurer may convert initialization information input from a control unit into an amount of electric charges and may store the amount of electric charges in a designated MOS capacitor. Here, the method described above with reference to FIG. 5 may be used as a method of converting the initialization information into the amount of electric charges using the input circuit 901. A gate voltage $V_{G1}$ of an input gate 1 903 may be set to 2 V, and accordingly a channel may be formed between an input diode 902 and an input gate 2 904. When a gate voltage applied to a detection region is assumed as 10 V, a potential well with a depth that is proportional to 10 V may be formed in a MOS capacitor of the detection region. An amount of electric charges injected through an input circuit may be proportional to "$V_{G2}-V_{G1}$" that is a difference in gate voltages between the input gate 2 904 and the input gate 1 903. Since the gate voltage $V_{G1}$ of the input gate 1 903 is set to 2 V in advance, the gate voltage $V_{G2}$ of the input gate 2 904 may be set to 12 V that is greater than the gate voltage $V_{G1}$ by 10 V, and accordingly a maximum amount of electric charges that may be stored by 10 V as a gate voltage of the detection region may be introduced into the input gate 2 904.

When the gate voltages of the input gate 1 903 and the input gate 2 904 are set as described above and when a voltage $V_D$ of the input diode 902 is set to a voltage, for example, 5 V, that is less than 12 V of the input gate 2 904, electrons may be input from the input diode 902 to the input gate 2 904. Although not shown in a part 900, as described above with reference to FIG. 5, when the voltage $V_D$ is set to a voltage, for example, 15 V, that is greater than the voltage $V_{G2}$ again after an input of electrons is completed, electrons greater than or equal to an amount of electric charges that may be stored in a potential well of the input gate 2 904 may be released again through the input diode 902. Through the above process, an amount of electric charges input to the measurer may be adjusted.

As described above with reference to FIG. 6, when a positive voltage (+), for example, a voltage of 5V as shown in the part 900, is applied to a reset switch 906 of an output circuit 905, $V_{DD}$ may be applied to the output circuit and an output voltage $V_{OUT}$ may be set as a reference voltage $V_{REF}$. Here, the reference voltage may be set in advance based on a characteristic of the output circuit 905. For example, when the reference voltage is assumed as 8 V in the output circuit 905 of the part 900, the output voltage may be initialized by a voltage applied to the reset switch 906 at the time $T_1$, and accordingly the output voltage may be 8 V at the time $T_1$ as shown in a part 907.

Referring to FIG. 9B, operation 910 is performed at a time $T_2$. In operation 910, the electric charges input in operation 900 may be moved to a pre-designated MOS capacitor for an electric field measurement. Also, a gate voltage with an appropriate magnitude may be applied to a plurality of MOS capacitors included in a detection region so as to enable an inflow and outflow of electrons due to an electric field.

Referring to a part 910, electrons input to the measurer through operation 900 may be transferred to a potential well 2 913 formed in a MOS capacitor E through the electric charge transfer operation of FIG. 4A. Here, due to a voltage of 10 V applied to a phase line 2 915, a potential well 3 914 and a potential well 1 912 may be formed in a MOS capacitor B and a MOS capacitor H, respectively. Referring to a part 916, since an output circuit does not output an electric charge yet, a state in which a reference voltage is output may be maintained. Accordingly, the output voltage of 8 V at the time $T_2$ may remain unchanged.

Operation 802 of FIG. 8 may be performed. Here, an electric charge distribution of a plurality of MOS capacitors included in the measurer may change based on an intensity and direction of an electric field. Referring to FIG. 9C, an operation 920 of measuring an electric field is performed at a time $T_3$. In operation 920, when a MOS capacitor in which electrons are stored is exposed to an electric field, a portion of electrons stored in a potential well 2 may flow out and move to a neighboring empty potential well. For example, in a part 920, a portion of electric charges stored in a potential well 2 922 may be released due to an influence of an electric field, and accordingly an amount of electric charges stored in the potential well 2 922 may be reduced. The electric charges released from the potential well 2 922 may move in an opposite direction to a direction of the electric field and may flow into a potential well 1 921. Thus, an amount of electric charges stored in the potential well 1 921 may increase.

In operation 804 of FIG. 8A, the output measurement result may be compared to the initialization information input in operation 801, and the information about the intensity and direction of the electric field may be calculated.

Referring to FIGS. 9D and 9E, an operation of acquiring information about an intensity and direction of an electric field may be performed at times $T_4$, $T_5$ and $T_6$. Referring to a part 930, electric charges stored in each of potential wells may move to a MOS capacitor I that is the last MOS capacitor in the detection region. The electric charges may be output to the outside through the output circuit 931, to drop the output voltage. Referring to a part 932, when electric charges of a potential well 1 are output first, a voltage drop 933 corresponding to $\Delta V_1$ may occur. For example, an output voltage $V_{OUT}$ at the time $T_4$ is 6 V as shown in a part 932, and accordingly $\Delta V_1$ may be 2 V.

Referring to a part 940, when an output of electric charges stored in a potential well 1 is completed, the output circuit may be initialized again to the reference voltage as indicated by reference numeral 943. While electric charges in a potential well 2 are output, a voltage drop 944 corresponding to $\Delta V_2$ may occur. For example, an output voltage $V_{OUT}$ 944 of the potential well 2 is 3 V at a time $T_5$ of a part 942, and accordingly $\Delta V_2$ may be 5 V. Electric charges in a potential well 3 may be output. Because it is assumed that an electron does not flow into the potential well 3 in an electric field measurement operation of FIG. 9C, an amount of electric charges in the potential well 3 may be "0." Thus, an output voltage $V_{OUT}$ 945 of the potential well 3 may remain unchanged at 8V, and accordingly $\Delta V_3$ may be 0 V.

As described above, electric field measurement results that are output in forms of voltages may be transmitted to the control unit, and the control unit may determine an intensity and direction of an electric field based on the electric field measurement results. For example, a measurement result transmitted from the measurer may be represented by a magnitude of an output voltage of the output circuit of FIG. 6, and may be converted into a digital signal in the signal converter/collection of the control unit. The digital signal may be input to a pre-designed program, and the like, and may be used to calculate an intensity and direction of an electric field.

The above-described devices may be implemented using a hardware component, a software component and/or a combination thereof. A processing device may be implemented using one or more general-purpose or special purpose computers, such as, for example, a processor, a controller and an arithmetic logic unit (ALU), a digital signal processor (DSP), a microcomputer, a field programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The invention claimed is:

1. An electric field measurement device for measuring an electric field, the electric field measurement device comprising:
   a metal-oxide-semiconductor (MOS) capacitor exposed to an electric field; and
   a control unit configured to control the MOS capacitor so that information stored in the MOS capacitor is changed by the electric field,
   wherein the control unit is further configured to control a gate voltage applied to the MOS capacitor,
   wherein a potential well in a substrate region of the MOS capacitor is generated when electrical potential energy is lowered by the gate voltage, the potential well storing at least a portion of electric charges before exposure to the electric field,
   wherein the at least a portion of electric charges stored in the potential well is released in response to the exposure to the electric field above a threshold energy corresponding to a difference between an amount of electric charges storable in the potential well and an amount of electric charges actually stored in the potential well, and
   wherein the electric field is measured based on the at least a portion of electric charges released due to the exposure to the electric field.

2. The electric field measurement device of claim 1, wherein the information stored in the MOS capacitor comprises the amount of electric charges stored in the MOS capacitor.

3. The electric field measurement device of claim 1, wherein the MOS capacitor is configured to store electric charges in the substrate region of the MOS capacitor based on the gate voltage applied to a gate electrode of the MOS capacitor.

4. The electric field measurement device of claim 1, wherein an intensity of the electric field is calculated based on a difference between an amount of electric charges stored in advance in the MOS capacitor before the MOS capacitor is exposed to the electric field and an amount of electric charges stored in the MOS capacitor after the MOS capacitor is exposed to the electric field.

5. The electric field measurement device of claim 1, further comprising an input circuit configured to supply electric charges stored in the MOS capacitor.

6. An electric field measurement device for measuring an electric field, the electric field measurement device comprising:
- a measurer comprising a plurality of metal-oxide-semiconductor (MOS) capacitors; and
- a control unit configured to control the measurer so that information stored in at least one MOS capacitor among the plurality of MOS capacitors is changed by an electric field,
- wherein the control unit is further configured to control a gate voltage applied to each of the plurality of MOS capacitors,
- wherein a potential well in a substrate region of the at least one MOS capacitor is generated when electrical potential energy is lowered by the gate voltage, the potential well storing at least a portion of electric charges before exposure to the electric field,
- wherein the at least a portion of electric charges stored in the potential well is released in response to the exposure to the electric field above a threshold energy corresponding to a difference between an amount of electric charges storable in the potential well and an amount of electric charges actually stored in the potential well, and
- wherein the electric field is measured based on the at least a portion of electric charges released due to the exposure to the electric field.

7. The electric field measurement device of claim 6, wherein the measurer uses, as a measuring unit, the at least one MOS capacitor among the plurality of MOS capacitors.

8. The electric field measurement device of claim 6, wherein the control unit is configured to control gate voltages applied to the MOS capacitors so that an electric charge released from a first MOS capacitor included in the measurer is introduced by the electric field into at least one of second MOS capacitors located around the first MOS capacitor.

9. The electric field measurement device of claim 6, wherein the measurer is configured to measure an electric field simultaneously at a plurality of positions using a plurality of measuring units, wherein each of the plurality of measuring units comprises at least one of the plurality of MOS capacitors.

10. The electric field measurement device of claim 6, further comprising at least one input circuit configured to supply electric charges stored in a first MOS capacitor included in the measurer and second MOS capacitors located around the first MOS capacitor.

11. The electric field measurement device of claim 6, wherein the measurer comprises:
- a substrate formed of a semiconductor material;
- an insulating material laminated on the substrate; and
- gate electrodes laminated on the insulating material.

12. An electric field measurement method using a metal-oxide-semiconductor (MOS) capacitor, the electric field measurement method comprising:
- initializing an electric field measurement device by storing first information in at least one MOS capacitor included in the electric field measurement device before the at least one MOS capacitor is exposed to an electric field;
- controlling a gate voltage applied to the at least one MOS capacitor, wherein a potential well in a substrate region of the MOS capacitor is generated when electrical potential energy is lowered by the gate voltage, the potential well storing at least a portion of electric charges corresponding to the first information before exposure to the electric field, and wherein the at least a portion of electric charges stored in the potential well is released in response to the exposure to the electric field above a threshold energy corresponding to a difference between an amount of electric charges storable in the potential well and an amount of electric charges actually stored in the potential well;
- receiving second information stored in the at least one MOS capacitor after the at least one MOS capacitor is exposed to the electric field; and
- acquiring at least one of information associated with an intensity of the electric field or information associated with a direction of the electric field based on the first information and the second information.

13. The electric field measurement method of claim 12, wherein the first information comprises the amount of electric charges stored in the at least one MOS capacitor, to initialize the at least one MOS capacitor.

14. The electric field measurement method of claim 12, wherein the initializing comprises determining the first information based on at least one of a sensitivity to an outflow of an electric charge stored in the at least one MOS capacitor due to the electric field or a sensitivity to an inflow of the electric charge flowing out from the at least one MOS capacitor into at least one other MOS capacitor.

15. The electric field measurement method of claim 12, wherein the initializing comprises determining the gate voltage that is to be applied to the MOS capacitors based on at least one of a sensitivity to an outflow of an electric charge to be stored in the at least one MOS capacitor due to the electric field or a sensitivity to an inflow of the electric charge flowing out from the at least one MOS capacitor into at least one other MOS capacitor.

16. The electric field measurement method of claim 12, wherein the initializing comprises setting an exposure time in which the at least one MOS capacitor is to be exposed to the electric field, and a number of exposures of the at least one MOS capacitor to the electric field.

17. The electric field measurement method of claim 12, wherein the controlling comprises controlling the gate voltage of the MOS capacitors so that the first information is changed by the electric field.

18. The electric field measurement method of claim 12, further comprising determining whether an end condition of an electric field measurement is satisfied, based on an exposure time and a number of exposures that are set during the initializing.

19. The electric field measurement method of claim 12, wherein the acquiring comprises at least one of:
- calculating the intensity of the electric field based on the first information, the second information and the gate voltage applied to the at least one MOS capacitor; or
- calculating the direction of the electric field based on the first information and the second information.

* * * * *